US006897496B2

(12) United States Patent
Yamada et al.

(10) Patent No.: US 6,897,496 B2
(45) Date of Patent: May 24, 2005

(54) SEMICONDUCTOR DEVICE, A METHOD OF MANUFACTURING THE SAME AND STORAGE MEDIA

(75) Inventors: Toshio Yamada, Koganei (JP); Kazumasa Yanagisawa, Kokubunji (JP); Yoshihiro Shinozaki, Fukuoka (JP); Hidetomo Aoyagi, Hamura (JP)

(73) Assignees: Hitachi, Ltd., Tokyo (JP); Renesas Technology Corporation, Tokyo (JP)

( * ) Notice: Subject to any disclaimer, the term of this patent is extended or adjusted under 35 U.S.C. 154(b) by 331 days.

(21) Appl. No.: 09/982,839

(22) Filed: Oct. 22, 2001

(65) Prior Publication Data

US 2002/0064064 A1 May 30, 2002

(30) Foreign Application Priority Data

Nov. 30, 2000 (JP) .................................... 2000-364112

(51) Int. Cl.[7] .............................................. H01L 29/73
(52) U.S. Cl. ....................... 257/208; 257/207; 257/209; 257/210; 257/211
(58) Field of Search .................................. 257/345, 207, 257/208, 209, 210, 211

(56) References Cited

U.S. PATENT DOCUMENTS

| 5,514,895 | A | * | 5/1996 | Kikushima et al. | .......... | 257/378 |
| 5,946,477 | A | * | 8/1999 | Ito | ................................ | 716/9 |
| 6,274,895 | B1 | * | 8/2001 | Fujii et al. | .................... | 257/207 |
| 6,622,293 | B1 | * | 9/2003 | Suzuki et al. | ................. | 716/12 |
| 6,714,903 | B1 | * | 3/2004 | Chu et al. | ...................... | 703/19 |

* cited by examiner

*Primary Examiner*—Van Thu Nguyen
*Assistant Examiner*—Douglas Menz
(74) *Attorney, Agent, or Firm*—Reed Smith LLP; Stanley P. Fisher, Esq.; Juan Carlos A. Marquez, Esq.

(57) ABSTRACT

Outside-cell wiring that extends the upper part of a macro cell to the direction of X axis is composed of the wiring layer of the upper layer than a terminal for a signal of the macro cell and this terminal is formed to extend in the direction of Y axis (direction that intersects the direction of X axis) so that the outside-cell wiring can be secured for a plurality of wiring channels. The macro cell and the outside-cell wiring are connected via this signal terminal.

22 Claims, 19 Drawing Sheets

FIG. 6
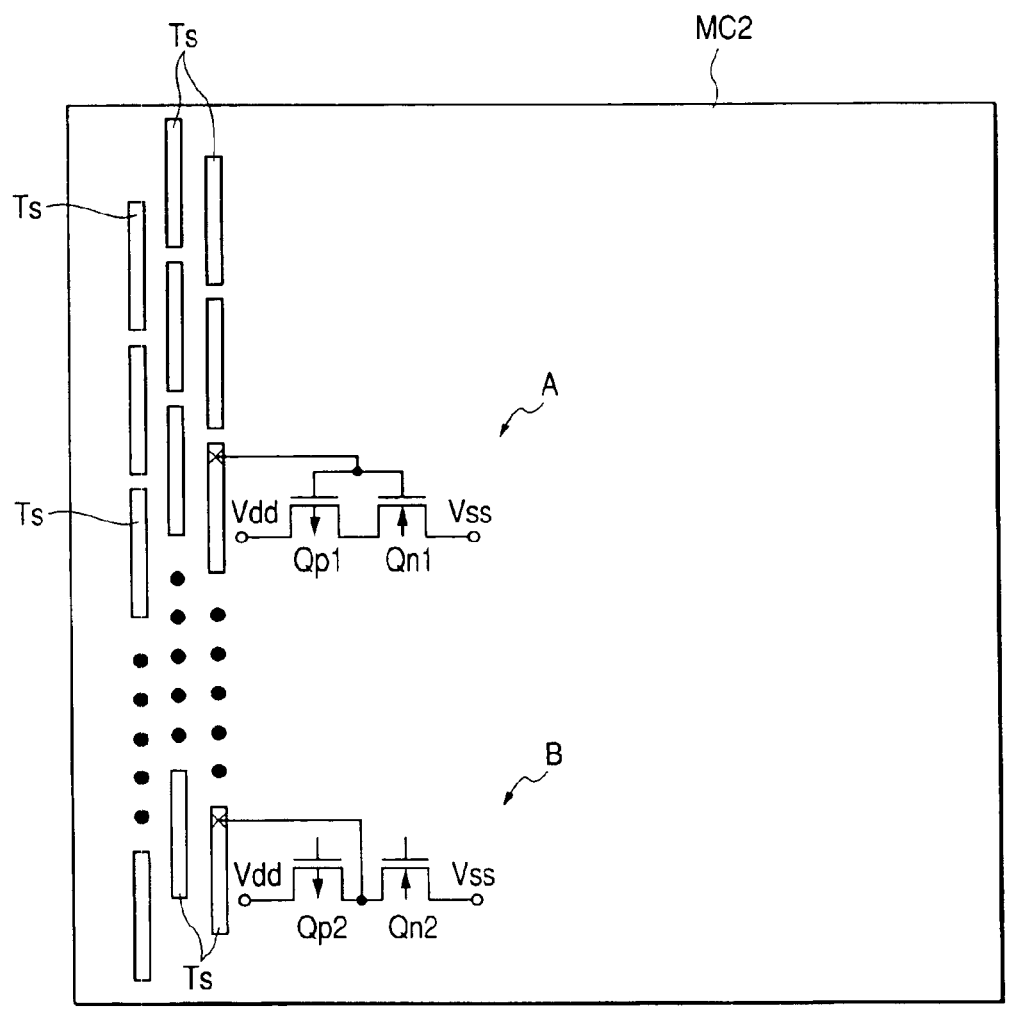
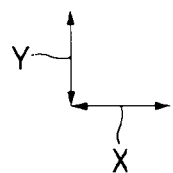

US 6,897,496 B2

SEMICONDUCTOR DEVICE, A METHOD OF MANUFACTURING THE SAME AND STORAGE MEDIA

TECHNICAL FIELD

The present invention relates to a semiconductor device, a method of manufacturing the semiconductor device and an art of storage media, and, more particularly, to an effective art that applies to a layout design art of a semiconductor device.

BACKGROUND OF THE INVENTION

In the layout design of a semiconductor device, there are various layout design methods according to the type of the semiconductor device. A layout design method examined by the inventors is a macro cell (mega cell) method, for example. This method is effective when a system, such as a micro processor, a memory, an I/O (input/output) device and a custom circuit, is constructed as a single chip, for example. The method is used to arrange various large and small circuit blocks in a chip area and performs wiring between the circuit blocks.

SUMMARY OF THE INVENTION

However, in the art examined by the above inventors, the inventors have found out that the following problems are included.

That is, the wiring area required for connecting between circuit blocks results in a wasteful area on a semiconductor chip, and a chip size increases. FIG. 20 shows an example of the general circumstances. In the drawing, a signal terminal 50 and a power supply terminal 51 are arranged on a cell frame of a circuit block 52. If a plurality of circuit blocks 52 are arranged in the horizontal direction (direction of X axis) of FIG. 20, a wiring area 54 for arranging second layer wiring 53a and third layer wiring 53b between the adjoining circuit blocks 52 need be provided to connect signals between the circuit blocks 52. This increases the chip size.

An object of the present invention is to provide an art that can reduce a chip size.

These and other objects, and new features of the present invention will become evident from a description and appended drawings of this specification.

Among inventions disclosed in this application, an outline of the representative invention is briefly described below.

That is, in the present invention, a signal terminal for a circuit block is formed to secure a plurality of wiring channels in a second direction that intersects a first direction where a plurality of circuit blocks are arranged, and the signal terminal is drawn out by using first wiring that is the wiring of the upper layer than the signal terminal and extends to the first direction.

Further, in the present invention, the signal terminal is formed to extend in the second direction.

Moreover, in the present invention, the signal terminals are arranged in the first direction so that the signal terminals are mutually adjacent in the first direction, shifting them to the second direction.

Further, in the present invention, a power supply terminal is formed to extend in the second direction in the circuit block.

Moreover, in the present invention, a power supply terminal for a circuit block is formed to extend in a second direction that intersects a first direction where a plurality of circuit blocks are arranged, and the power supply terminal is drawn out by using first wiring that is the wiring of the upper layer than the power supply terminal and extends to the first direction.

Further, in the present invention, a memory circuit is formed in the circuit block.

BRIEF DESCRIPTION OF THE DRAWINGS

FIG. 6 is a plan view of a macro cell that constructs a semiconductor device according to another embodiment of the present invention;

DETAILED DESCRIPTION OF PREFERRED EMBODIMENTS

Figure 1:
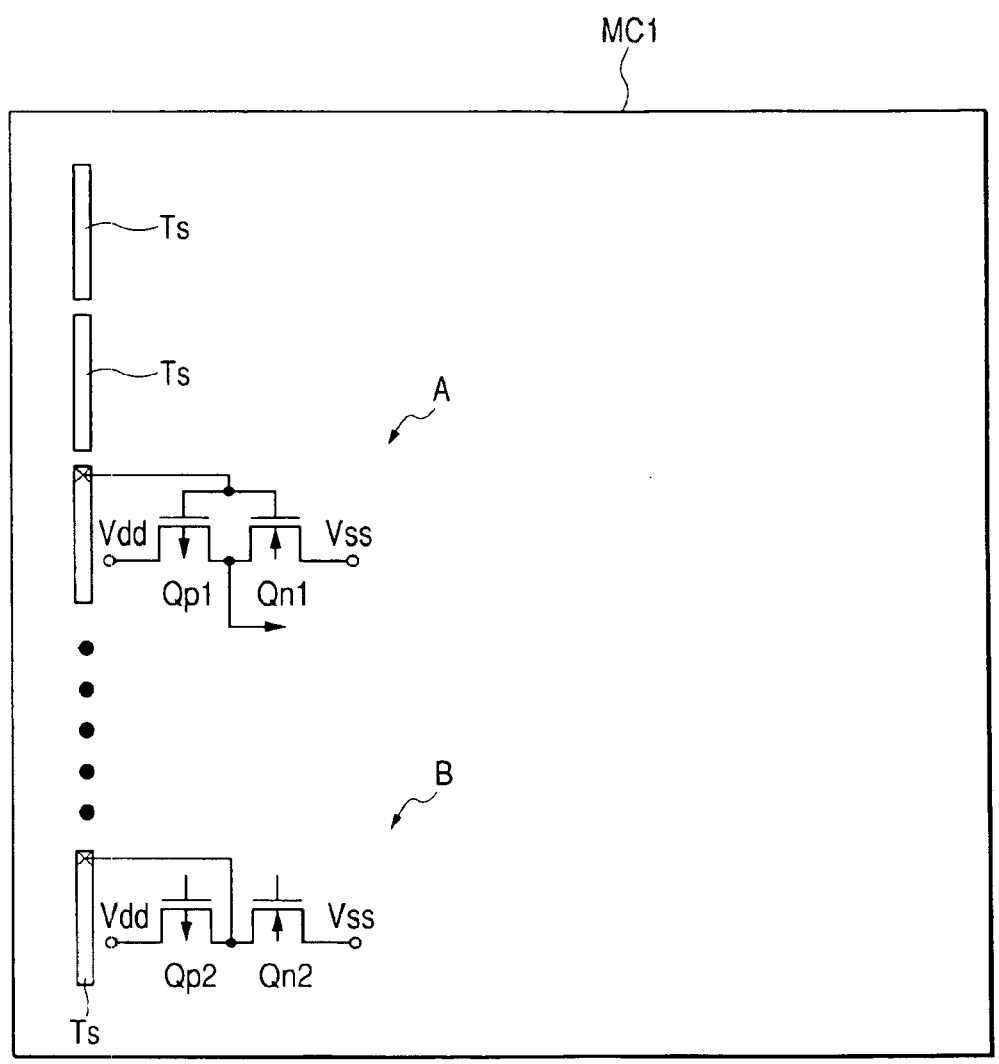
FIG. 1 is a plan view of a macro cell that constructs a semiconductor device according to one embodiment of the present invention.

Before the invention of this application is described in detail, the meanings of technical terms used in this application are described below.

1. A semiconductor device or semiconductor integrated circuit device includes not only a device that is produced on a semiconductor or insulator substrate, such as a silicon wafer and a sapphire substrate, but also a device that is produced on other insulating substrates of glass or the like, such as a TFT (thin-film-transistor) and STN (super-twisted-nematic) liquid crystal, unless otherwise specified in particular.

2. A macro cell indicates a circuit block or a function block which has a higher function and larger scale than a basic cell. The macro cell is classified into a hard macro in which a mask pattern is fixed and a soft macro in which library information is up to net list representation and that generates the mask pattern every design. The macro cell includes a standard cell (poly cell) of fixed height that represents a small-scale logic gate, a module cell, such as a RAM (random access memory) that has a regular layout structure and is automatically generated by a module generator in accordance with an input parameter, a ROM (read only memory), a PLA (programmable logic array), a multiplier, an adder or a data path, a CPU (central processing unit) or an analog cell and an I/O (input/output) cell. The macro cell registers cell frame and terminal information for automatic placement and routing and simulation information, such as a function model, a logic model and a delay parameter, in a design system (computer or the like) as a cell library in addition to the mask pattern information, and can use them by simply calling them from the cell library in case of simulation. The RAM and ROM are memory circuits (memory modules). As an example of the RAM, there is a DRAM (dynamic RAM), an SRAM (static RAM) or an FRAM (ferroelectric RAM). Further, as examples of the ROM, there is a mask ROM (MROM) and a flash memory (EEPROM; electric erasable programmable ROM).

3. Inside-cell wiring indicates signal and power supply wiring for mainly constructing a desired circuit (function) within a cell.

4. Outside-cell wiring (wiring outside a circuit block, first wiring) indicates signal and power supply wiring for mainly connecting between a plurality of cells and constructing the entire circuit.

5. An inner terminal indicates a terminal that is arranged in a cell frame of a macro cell.

6. An IP (intellectual property) indicates a circuit block in which an already designed circuit function block of which the operation is checked can be reused as a design asset.

7. A net list indicates design data that represents a connection relationship of an integrated circuit or the like. The net list has a format in which a computer can process data. In general, the connection relationship is hierarchically described to compact the data.

8. A wiring lattice is a line which indicates a path (wiring channel) through which wiring is placed and consists of a plurality of wiring lattice lines that mutually cross at right angles. Besides, there are two types of wiring lattices. In one type, the boundary between the wiring lattice and a macro cell matches, and in the other type, the boundary does not match. Since the former can place wiring in the boundary of the macro cell, wiring simplicity can be improved. Since the latter can reduce a cell size, the size of a semiconductor chip can be reduced.

In the following embodiments, they are described by being divided into multiple sections or aspects when they are necessary for convenience. Except when specified in particularly, the section and aspect are related mutually. One side is related to a part or all parts of modification examples, details and supplementary explanations of the other side.

Further, in the following embodiments, when reference is made to the number of elements (including the number of items, numeric values, quantity and scope), the elements are not limited to the specific number and can exceed or go below the specific number except when they are specified in particular and are clearly limited to the specific number on principle.

Moreover, in the following embodiments, needless to say, the components (including element steps) are not necessarily indispensable except when they are specified in particular and considered to be indispensable clearly on principle.

Similarly, in the following embodiments, when reference is made to shapes and position relationships of components, the components substantially include those which are approximate or similar to the shapes except when they are specified clearly in particular and considered not to be indispensable on principle. This also applies to the above numeric values and scope.

Further, in all drawings for describing this embodiment, the same symbol are affixed to the same function and a description of the repetition is omitted.

Moreover, in this embodiment, an MIS-FET (metal insulator semiconductor field effect transistor) that stands for a field effect transistor is abbreviated as an MIS, a p-channel type MIS-FET is abbreviated as a pMIS, and an n-channel type MIS-EFT is abbreviated as an nMIS.

The embodiments of the present invention are described below in details with reference to the drawings.

(Embodiment 1)

Figure 2:
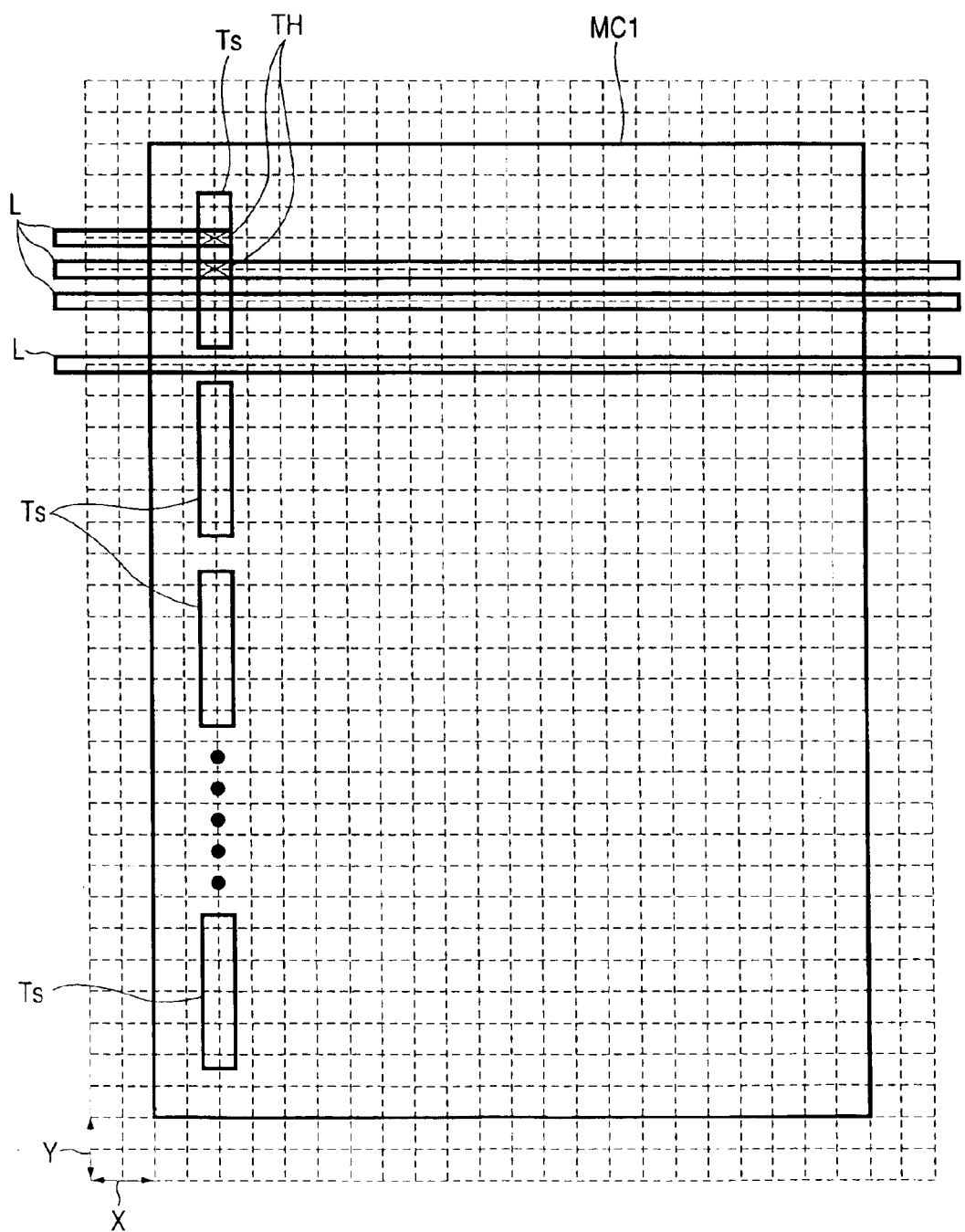
FIG. 2 is a plan view of a layout plane on which a wiring lattice and outside-cell wiring are added to FIG. 1.

FIG. 1 shows a plan view of a macro cell MC 1 that is a circuit block that constructs a semiconductor device according to one embodiment of the present invention. Further, FIG. 2 shows a layout plan view on which a wiring lattice (dashed line) and outside-cell wiring L are added to FIG. 1. Besides, the interval of mutually adjoining wiring lattices on the semiconductor device is about 0.5 $\mu$m, for example.

This micro cell MC 1 constructs a predetermined circuit function by electrically connecting a plurality of integrated circuit elements arranged in a cell frame, for example, using inside-cell wiring. The inside-cell wiring is composed of first and second layer wiring. FIG. 1 illustrates an input circuit A and an output circuit B of the macro cell MC1. The input circuit A consists of a CMIS (complementary MIS) inverter circuit and has a pMISQp 1 and an nMISQn 1. Further, the output circuit B has a pMISQp 2 and an nMISQn 2. Besides, FIG. 2 illustrates a method by which the cell frame of the macro cell MC 1 is arranged on a wiring lattice line. The method of arranging the cell frame is not limited to this method. For example, a method of arranging the cell frame by being shifted by a half pitch between the adjoining wiring lattice lines can also be used.

The macro cell MC 1 has a plurality of signal terminals Ts. This terminal Ts is a conductor unit for sending and receiving a signal between a circuit formed in the macro cell MC1 and a circuit outside the macro cell MC1 and formed using wiring on the top wiring layer in the MC cell MC 1. In the diagram, the terminal Ts is constructed using the second layer wiring, for example. Further, the diagram illustrates the state in which the input of the input circuit A and the output of the output circuit B in the macro cell MC 1 are electrically connected. The pMISQp 1 and nMISQn 1 gate electrodes of the input circuit A are electrically connected to the terminal Ts and the pMISQp 2 and nMISQp 2 source areas of the output circuit B are electrically connected to the terminal Ts. A power supply voltage Vdd is supplied to the pMISQp 1 and nMISQp 2 source areas and a power supply voltage Vss of lower potential than the power supply voltage Vdd is supplied to the nMISQn 1 and nMISQn 2 source areas. Besides, these power supply voltages Vdd and Vss will be described later. Further, the terminal Ts is electrically connected to the input circuit A and the output circuit B using the second layer wiring, the first layer wiring that is the wiring layer of the lower layer than the second layer wiring or both the wiring.

Further, the terminal Ts, in the cell frame of the macro cell MC 1, is arranged in the vicinity of a side that runs along the vertical direction (direction of Y axis (second direction) and in a row along the side. Between the terminals Ts adjacent in the direction of Y axis, for example, a space is placed so that the only one wiring lattice line that extends to the horizontal direction (direction of X axis (first direction) of FIGS. 1 and 2 can be arranged. The area of the macro cell MC 1 can be reduced by arranging the terminal Ts in the cell frame in this manner (that is, using an inner terminal). Further, the plural terminals Ts can be arranged without increasing the area of the macro cell MC 1. However, the present invention is not limited to this. For example, it can also apply to the structure in which the terminal Ts is arranged on the cell frame. Moreover, the drawing illustrates the case where this terminal (inner terminal) Ts is arranged in a row, but can also be arranged in a plurality of rows. This will be described later.

Further, in this embodiment, the terminal (inner terminal) Ts is formed along a wiring lattice line that extends to the direction of Y axis and on the line, as shown in FIG. 2, using a plane and rectangular pattern that is long in the direction of Y axis. That is, the terminal Ts extends to the direction of Y axis and is formed so that the plural wiring lattice lines that extend to the direction of X axis can pass through it. Hereupon, the direction of Y axis dimensions of the terminal Ts are set here so that the terminal can pass through the two wiring lattice lines or more in the direction of X axis. The direct connection from the outside of the macro cell MC1 to the terminal Ts is performed using outside-cell wiring L that forms aerial wiring of the macro cell MC 1. This outside-cell wiring L consists of wiring of the wring layer of the upper layer than the terminal (inner terminal) Ts, for example, third layer wiring, and is arranged along a wiring lattice line that extends to the direction of X axis and on the line. The outside-cell wiring L is electrically connected to the terminal Ts via a through hole TH (refer to FIG. 2). Besides, the through hole TH is mainly arranged in the intersection between the wiring lattice line that extends to the direction of X axis and the wiring lattice line that extends to the direction of Y axis. The plural macro cells MC 1 can be arranged without any gap (even if a wiring area is not provided between the cells) by using the structure of such macro cell MC 1. Further, as a result of making the terminal Ts rectangular, the wiring channel efficiency in the placement and routing process can be improved and degrees of freedom of wiring can be improved. These can reduce a size (chip size) of a semiconductor chip.

Figure 3:
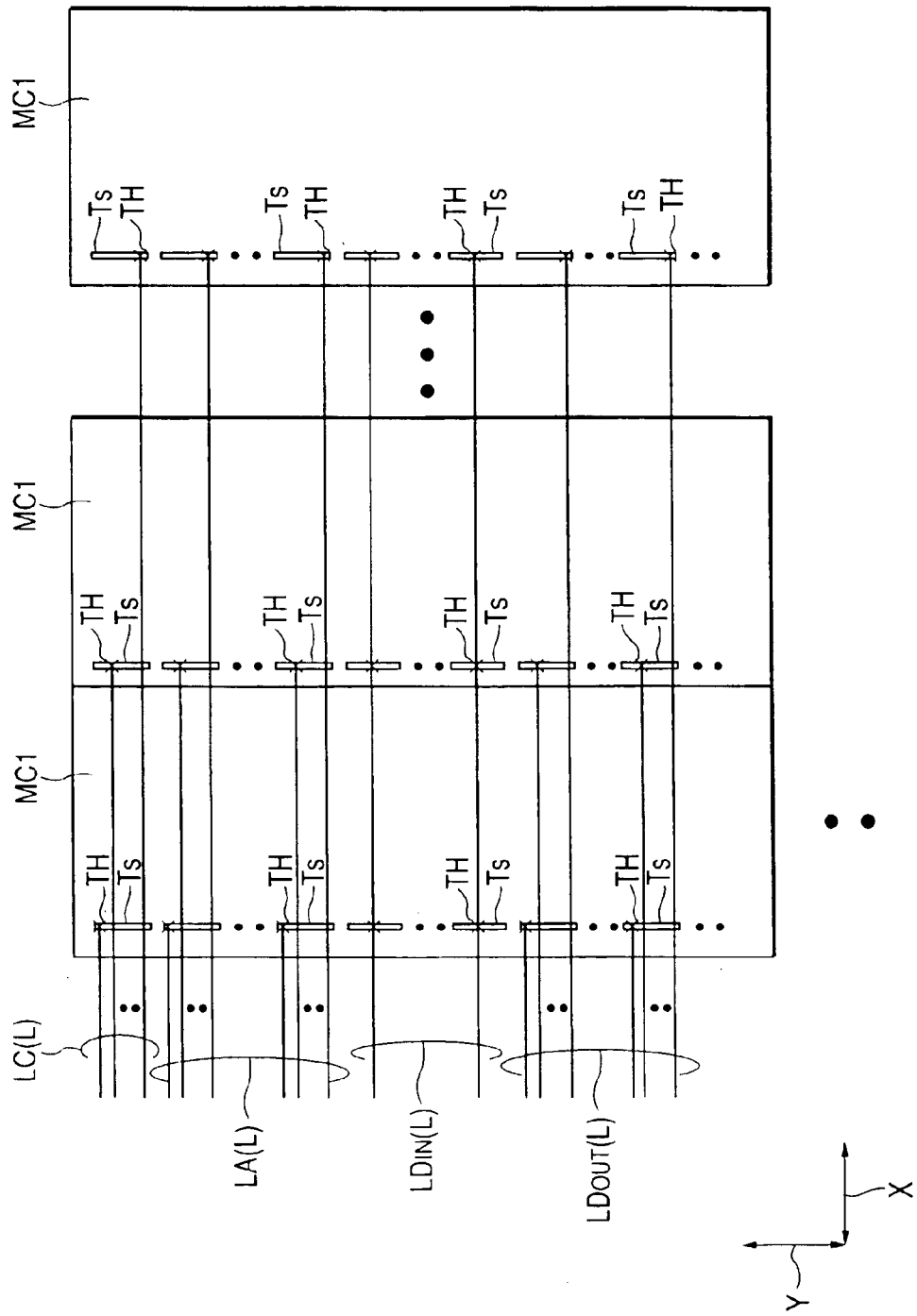
FIG. 3 is an explanatory drawing of one example of the principal part plane of the semiconductor device constructed by arranging the multiple macro cells of FIG. 1.
Figure 4:
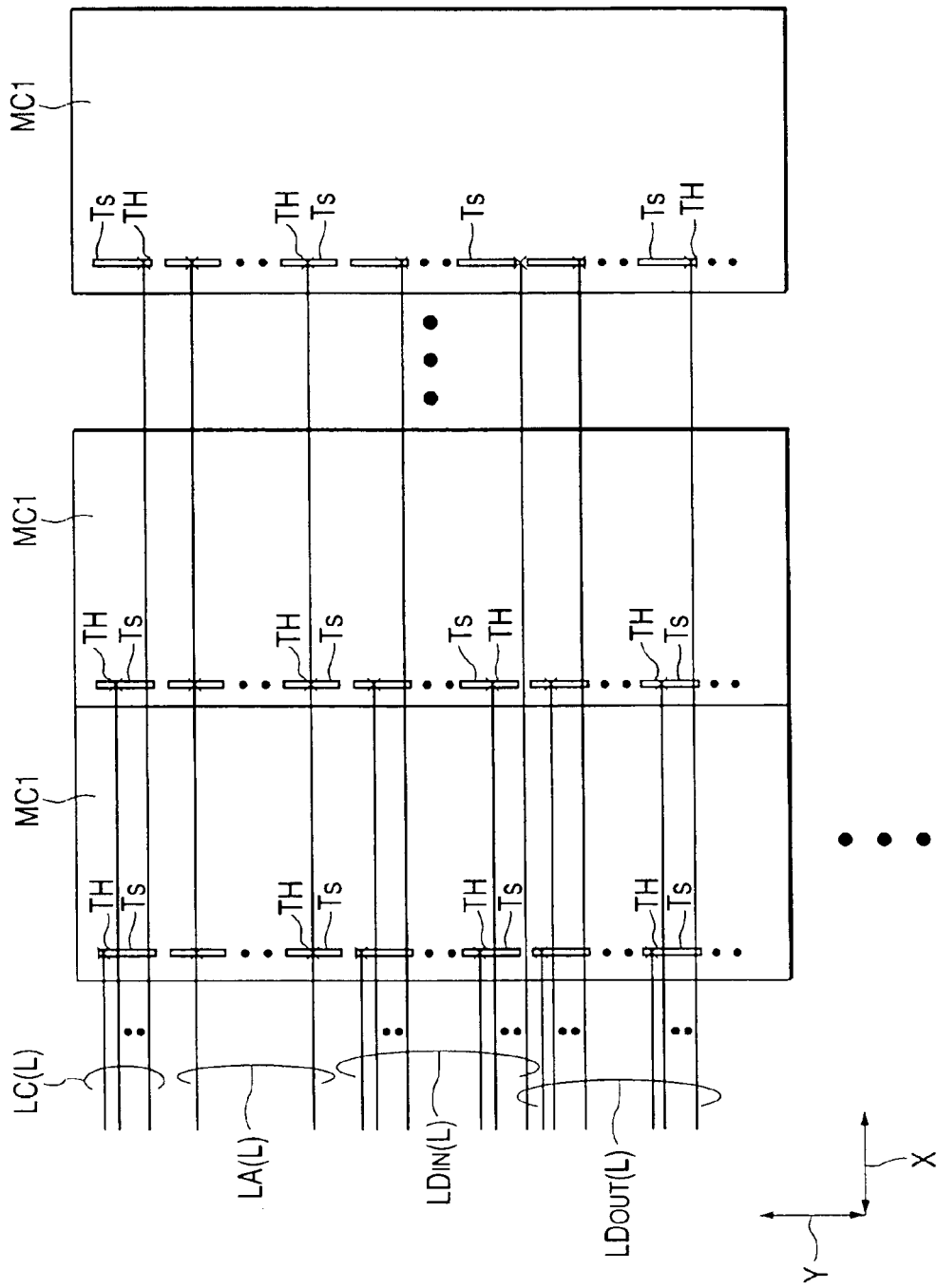
FIG. 4 is an explanatory drawing of another example of the principal part plane of the semiconductor device constructed by arranging the multiple macro cells of FIG. 1.

FIGS. 3 and 4 show an example of a memory circuit (module), such as a RAM or ROM, constructed by arranging m pieces of the macro cell MC1 in the direction of X axis and n pieces of the macro cell MC 1 in the direction of Y axis. FIG. 3 illustrates the case (address space extension) in which data input is made common and FIG. 4 illustrates the case (bit width extension) in which an address is made common. Besides, in the symbols of FIGS. 3 and 4, LC is the outside-cell wiring for a clock signal, LA indicates the outside-cell wiring for an address signal, LDIN indicates the outside-cell wiring for a data input signal and LDOUT indicates the outside-cell wiring for a data output signal. Any one illustrates the outside-cell wiring L.

In FIGS. 3 and 4, the configuration of each macro cell MC 1 is identical. For example, each macro cell MC 1 forms a RAM of a predetermined memory capacity. In FIG. 3, the macro cell MC 1 of which the data input is made common is arranged without any gap along the extending direction (direction of X axis) of the outside-cell wiring LC. Further, in FIG. 4, the macro cell MC 1 of which the address is made common is arranged without any space along the extending direction (direction of X axis) of the outside-cell wiring LA. The outside-cell wiring LA for the address signal, the outside-cell wiring LDIN for the data input signal and the outside-cell wiring LDOUT for the data output are arranged so as to extend the upper part of each macro cell MC to the direction of X axis.

That is, as shown in FIG. 3, the outside-cell wiring LA for the address signal and the outside-cell wiring LDOUT for the data output signal are electrically connected to each different macro cell MC 1 and the outside-cell wiring LDIN for the data input signal is electrically connected in common to these macro cells MC 1 respectively.

Further, as shown in FIG. 4, the outside-cell wiring LA of the address signal is electrically connected in common to these macro cells MC1 respectively and the outside-cell wiring LDIN for the data input signal and the outside-cell wiring LDOUT for the data output signal are electrically connected to each different macro cell MC 1.

According to this embodiment like this, as shown in FIGS. 3 and 4, since the terminal Ts of each macro cell MC 1 can be drawn out using the outside-cell wiring L of the third wiring layer of the upper layer, a wiring area for arranging signal wiring need not be provided between the macro cells MC 1. Accordingly, the plural macro cells MC 1 can be arranged without any gap in both the directions of X axis and Y axis. Therefore, a chip size can be reduced.

Further, in FIGS. 3 and 4, the outside-cell wiring LC for the clock signal is divided every macro cell MC 1. That is, the outside-cell wiring LC for the clock signal is electrically connected to each different macro cell MC 1. Accordingly, the power consumption of the entire semiconductor device can be reduced by operating only the necessary macro cell MC 1. Further, a clock signal that differs every macro cell MC can be input.

Figure 5:
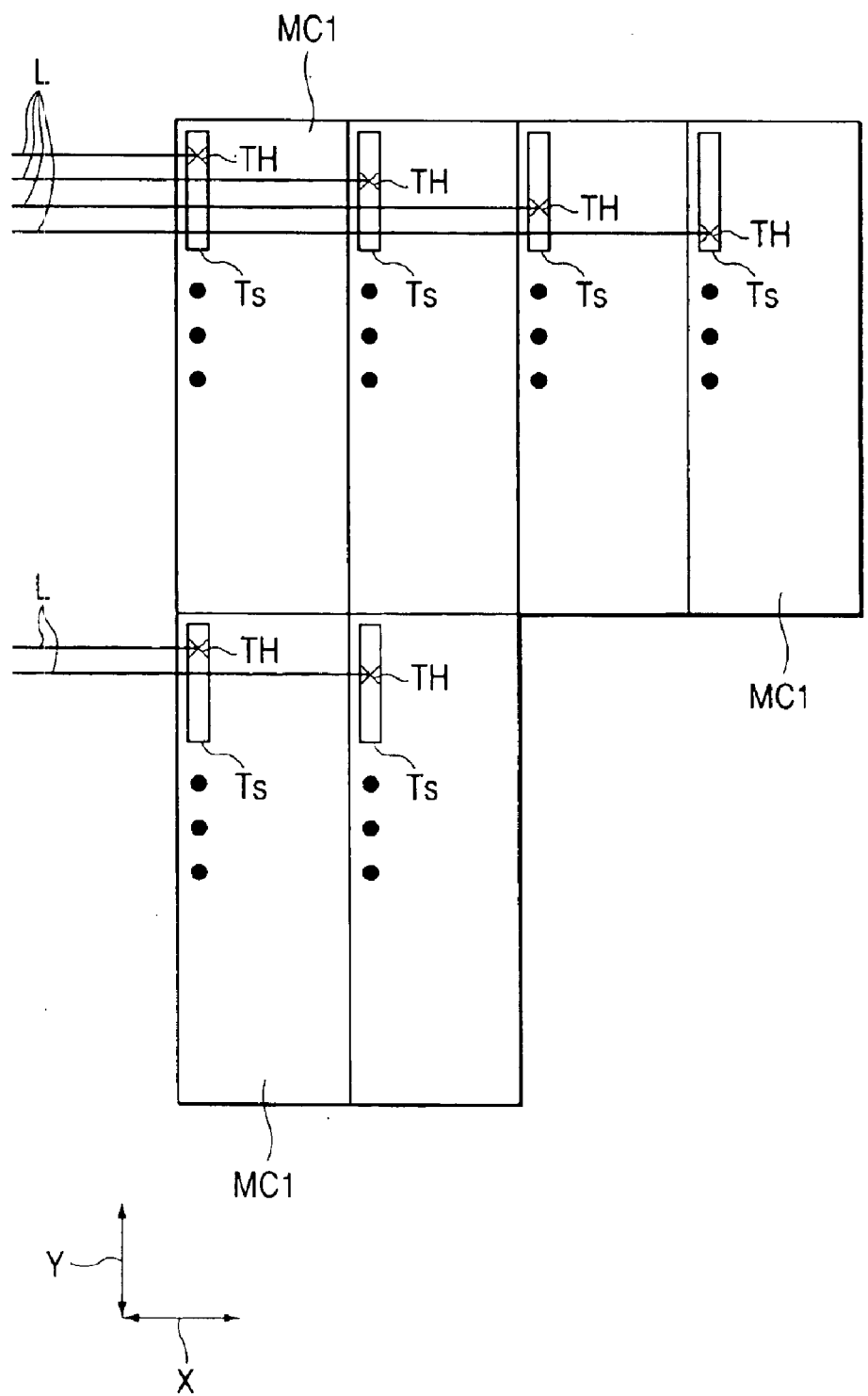
FIG. 5 is an explanatory drawing for describing the relationship between the placement of the macro cell of FIG. 1 and lengthwise dimensions of a signal terminal.

FIG. 5 is an explanatory drawing for describing the relationship between the placement of the macro cell MC 1 and the lengthwise dimensions of the signal terminal Ts. The diagram illustrates the case where the lengthwise dimensions of the terminal Ts are set to dimensions in which four wiring lattice lines that extend to the direction of X axis can be arranged. In this case, up to four macro cells MC 1 can be arranged without any gap in the direction of X axis. If this is exceeded, the outside-cell wiring cannot be arranged. Accordingly, in that case, the case where the macro cell MC 1 is expanded to the direction of Y axis is illustrated.

(Embodiment 2)

Figure 7:
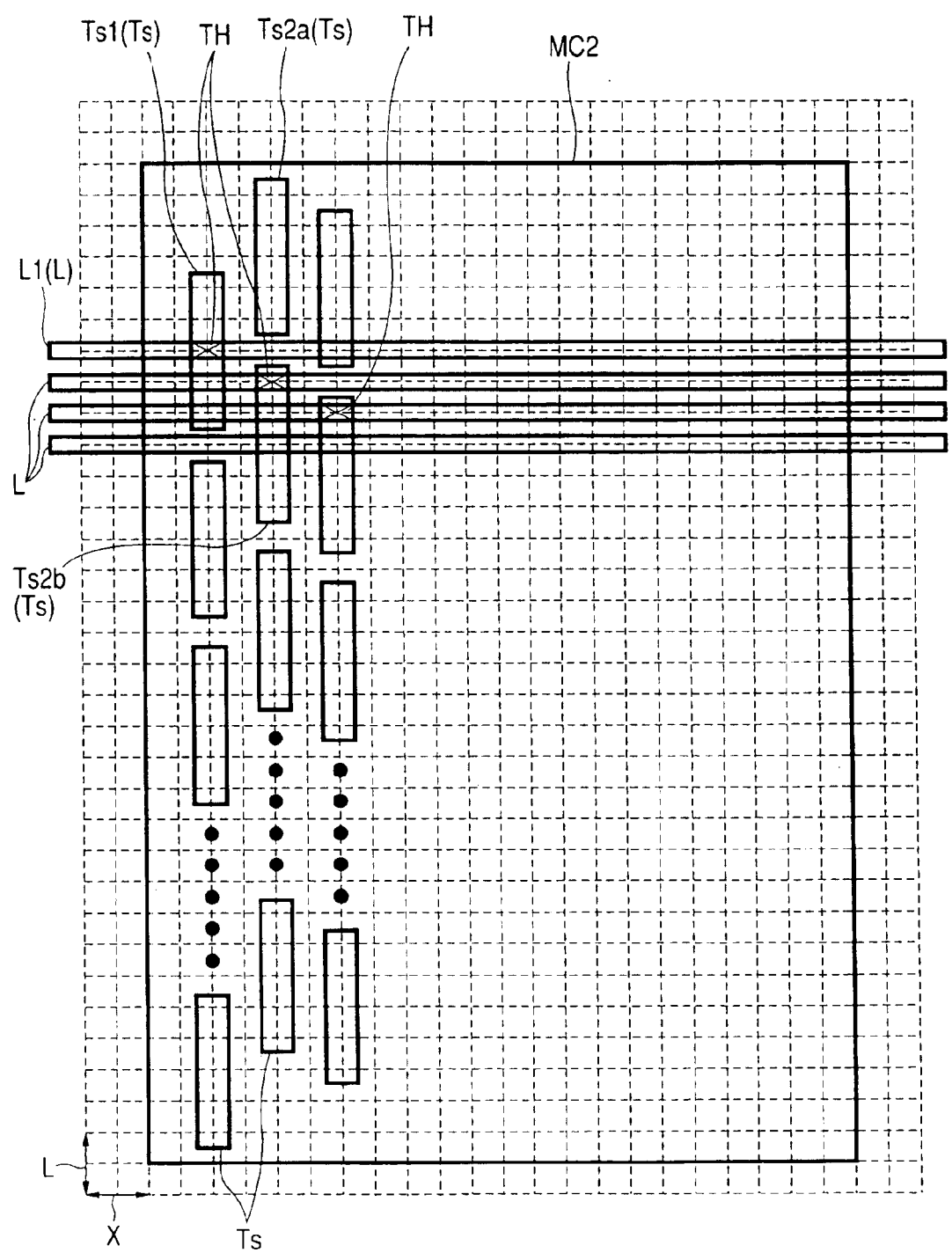
FIG. 7 is a plan view of a layout plane on which a wiring lattice and outside-cell wiring are added to FIG. 6.

This embodiment describes an example in which a plurality of columns of signal terminals are arranged. FIGS. 6 and 7 show the one example. FIG. 6 shows a plan view of a macro cell MC 2 that is a circuit block that constructs a semiconductor device according to this embodiment. Further, FIG. 7 shows a drawing in which a wiring lattice (dashed line) and out-wiring L are added to FIG. 6.

In the macro cell MC 2, the configuration other than the placement of the terminal Ts is the same configuration described in the macro cell MC 1 of the embodiment 1. In this embodiment, a plurality of columns of the terminal Ts are arranged in the direction of X axis. Further, the terminals Ts of mutually adjoining terminal columns are arranged, shifting them in the direction of Y axis. Accordingly, the efficient utilization of a wiring channel is enabled. For example, as shown in FIG. 7, the uppermost outside-cell wiring L1 (L) is electrically connected via the uppermost terminal Ts1 (Ts) in the leftmost terminal column and the through hole TH. This outside-cell wiring L1 extends not only to the upper part of the terminal Ts1 but also to the direction of X axis. Accordingly, if the position of the terminal Ts is not shifted to the direction of Y axis as described above, the connection unit (part of the wiring channel) of the terminals Ts2$a$ and Ta2$b$ in the second terminal column from the left is also damaged due to the placement of the uppermost outside-cell wiring L1. In this embodiment, since the position of the terminal Ts in the second terminal column from the left is shifted to the direction of Y axis against the position of the terminal Ts in the uppermost terminal column, the outside-cell wiring L1 can pass through the upper par of the wiring lattice line between terminals Ts2$a$ (Ts) and Ts2$b$ (Ts) that are adjacent to the direction of Y axis in the second terminal column from the left. Accordingly, in the second terminal column from the left, the connecting part on the terminals Ts2$a$ and Ts2$b$ will not be damaged by the outside-cell wiring L1. Thus, since the connectable part of the terminals Ts2$a$ and Ta2$b$ can be secured, the effective utilization of the wiring channel is enabled. Accordingly, since the degree of freedom of connecting the outside-cell wiring L can be secured, the reduction of a chip size can be promoted.

Figure 8:
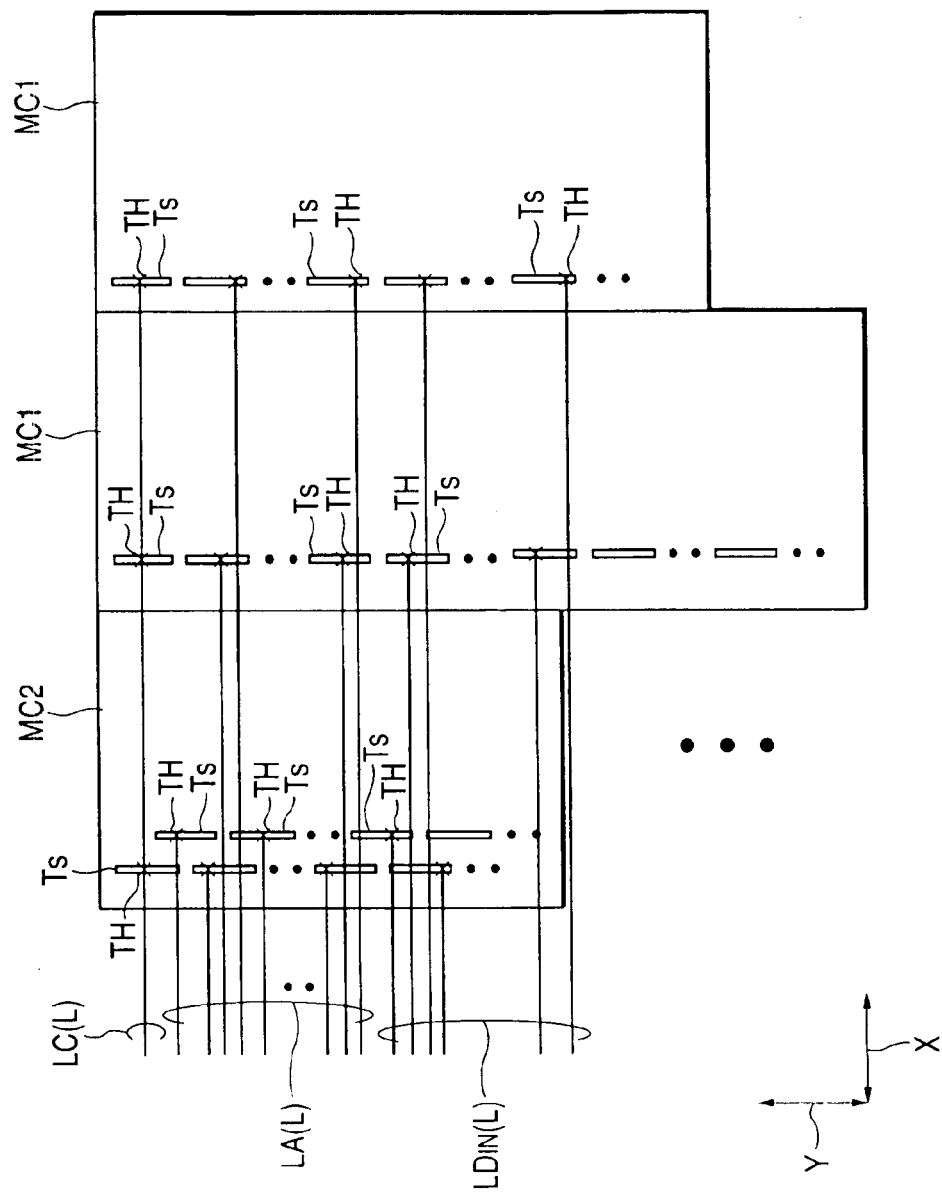
FIG. 8 is an explanatory drawing of one example of the principal part plane of the semiconductor device constructed by arranging the multiple macro cells of FIG. 1 and FIG. 6.

FIG. 8 shows an example of a memory circuit (module), such as a RAM or ROM constructed by arranging the plural macro cells MC 1 and MC 2. In the drawing, the configuration in which the sizes of the macro cells MC 1 and MC 2 differ is illustrated. Further, in the drawing, the case where the outside-cell wiring LC for the clock signals of the plural macro cells MC1 and MC2 of different sizes is made common is illustrated. Needless to say, multiple macro cells of which the sizes are identical but of which the types differ can be arranged.

(Embodiment 3)

Figure 9:
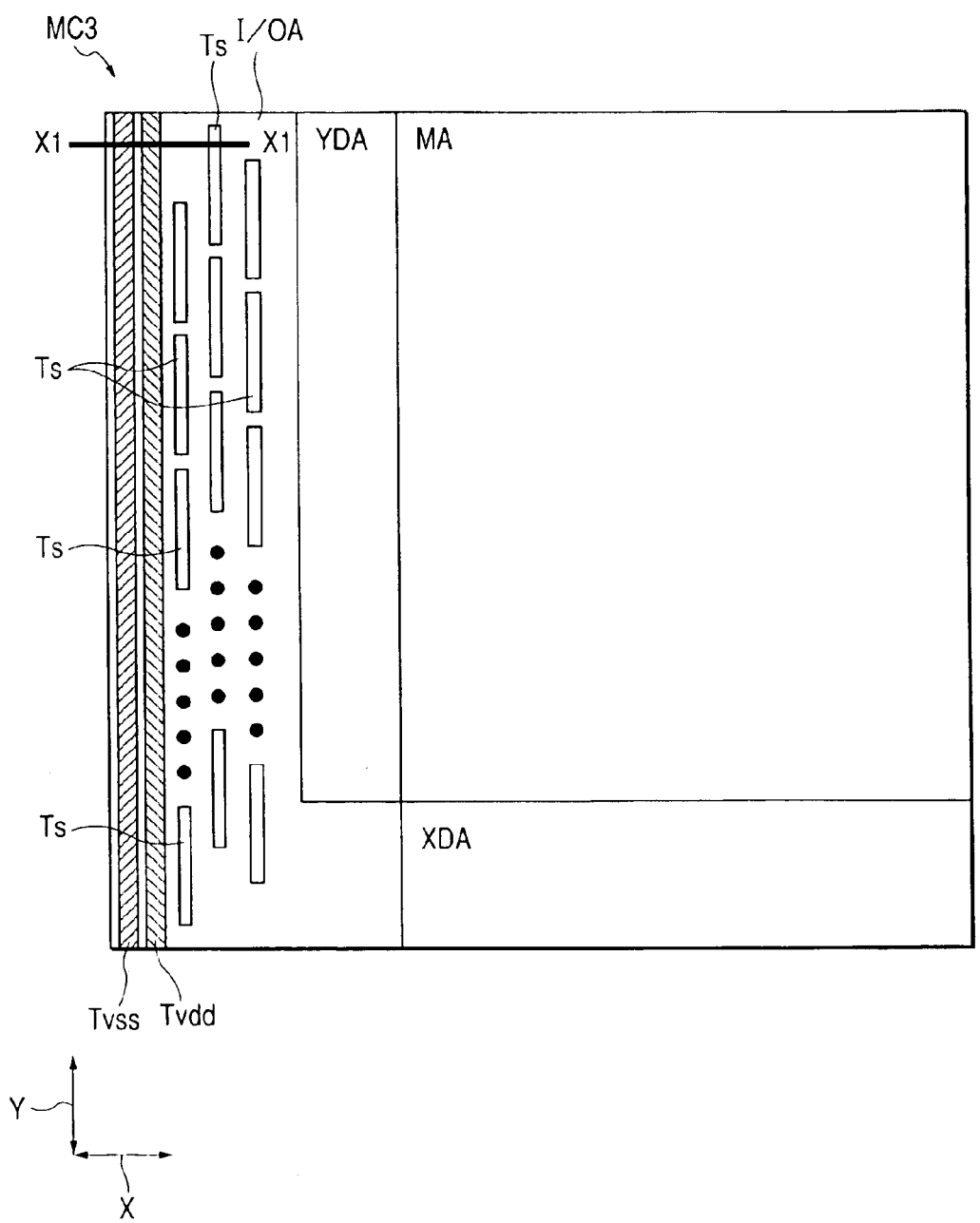
FIG. 9 is a plan view of an example of a macro cell according to another embodiment of the present invention.
Figure 10:
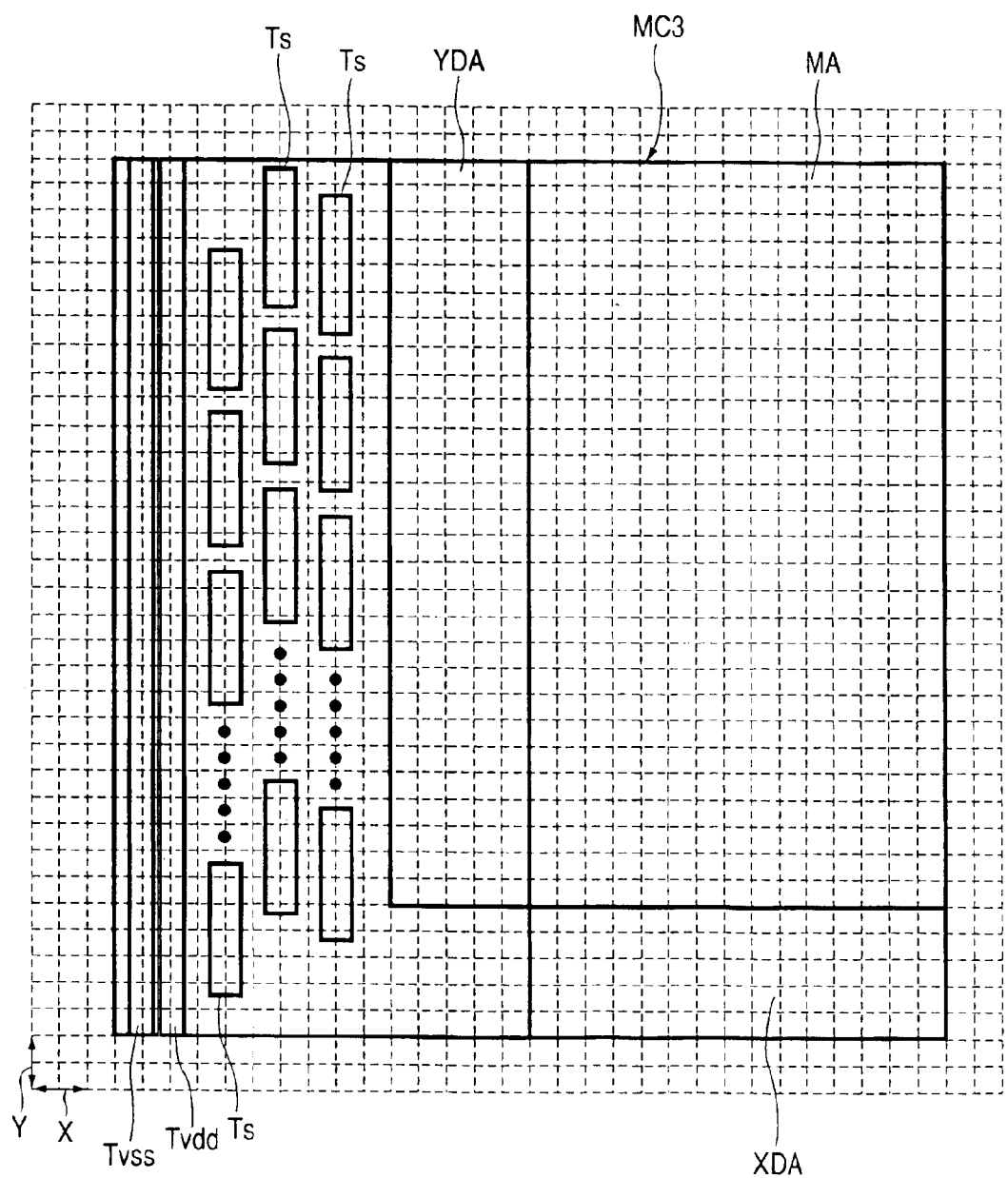
FIG. 10 is a plan view of a layout plane on which a wiring lattice is added to FIG. 9.
Figure 11:
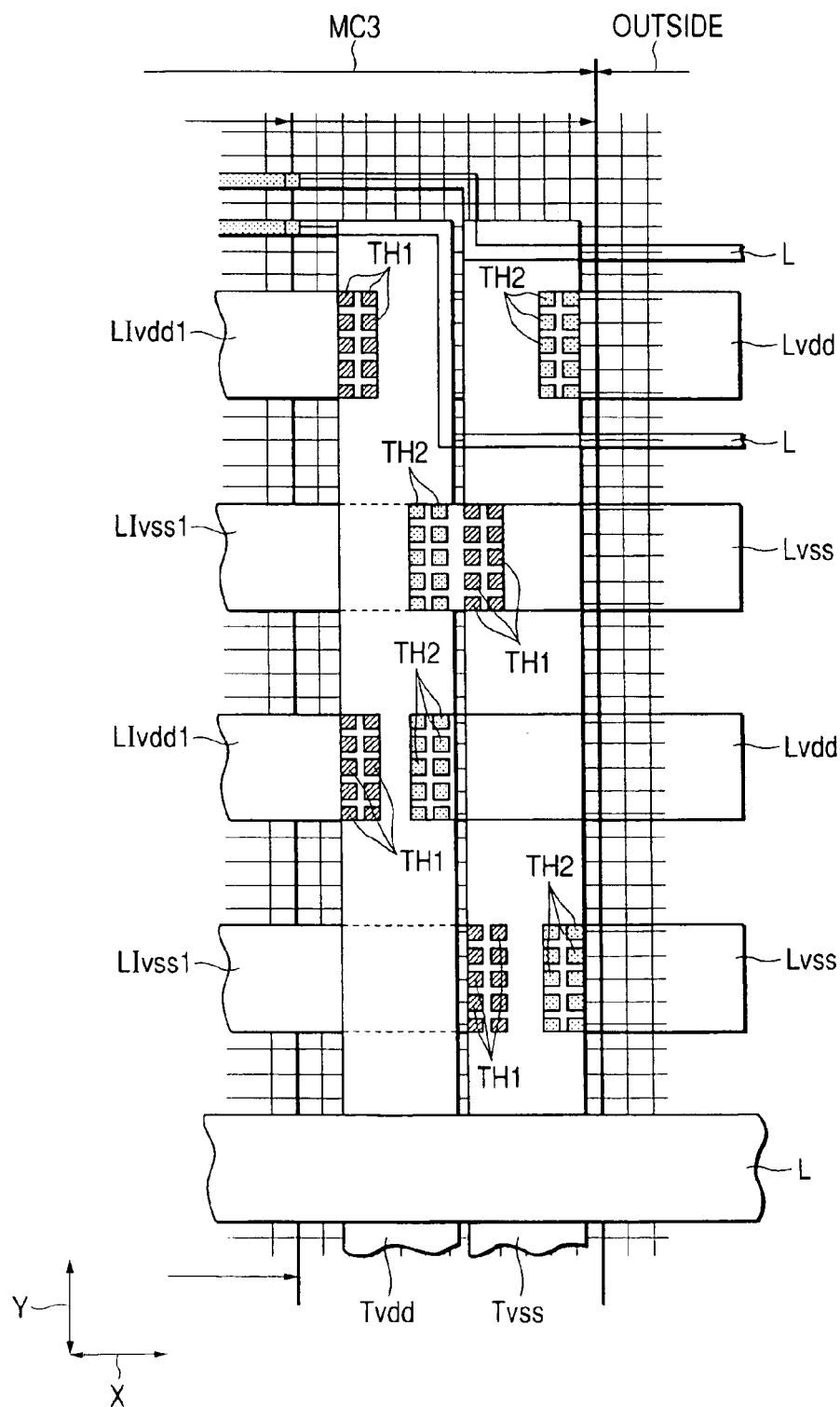
FIG. 11 is a principal part plan view showing the connected state between a power supply terminal, inside-cell wiring and outside-cell wiring of the macro cell of FIG. 9.
Figure 12:
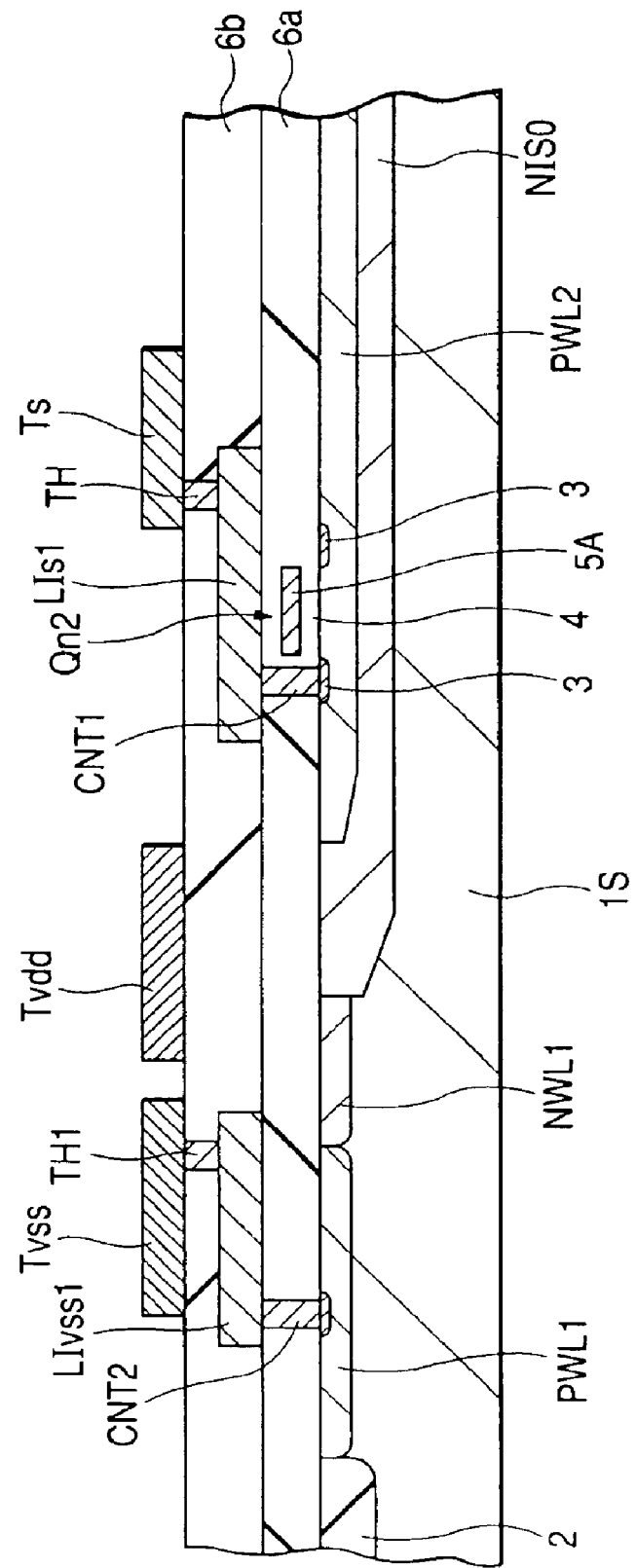
FIG. 12 is a sectional view of the line X1 to X1 of FIG. 9.

FIG. 9 is a plan view of a macro cell MC 3 that constructs a semiconductor device according to another embodiment of the present invention. FIG. 10 is a layout plan view on which a wiring lattice (dashed line) is added to FIG. 9. FIG. 11 is a principal part enlarged plan view of the macro cell MC 3 that is the circuit block of FIG. 9 and FIG. 12 shows a sectional view of the line X1 to X1 of FIG. 9 respectively.

The macro cell MC 3 forms a memory circuit (module), such as the RAM or ROM. A memory cell array MA, an X decoder area XDA, a Y decoder area YDA and an input/output circuit area I/OA are arranged in the cell frame of the macro cell MC 3. The memory cell array MA forms a memory circuit, such as a DRAM, an SRAM or an FRAM. That is, the memory cell array MA forms a memory cell, a word line and a data line. An X decoder circuit is formed on the X decoder area XDA and a Y decoder circuit is formed on the Y decoder area YDA. The memory cell is arranged in the intersection between the word line and data line. The word line is electrically connected to the X decoder circuit and the data line is electrically connected to the Y decoder circuit. An input/output bidirectional circuit is arranged in the input/output circuit area I/OA in addition to the input circuit and output circuit.

The placement of the signal terminal Ts is the same placement as described in the embodiment 2. Hereupon, the terminal (inner terminal) Ts is arranged in the input/output circuit area I/OA. That is, a wiring delay can be reduced by arranging the terminal Ts (inner terminal) in the input/output circuit area I/OA. Further, for this embodiment, in the input/output circuit area I/OA within the cell frame of the macro cell MC 3, power supply terminals Tvdd and Tvss are arranged at the position adjacent to a group of the signal terminals Ts. The power supply terminals Tvdd and Tvss supply a power supply voltage to the macro cell MC 3 and are formed along the lengthwise direction (direction of Y axis) of the signal terminal using strip patterns that extend from the upper end to the lower end of the cell frame. Accordingly, the power of the macro cell MC 3 can be obtained from any site within the dimensions of the direction of Y axis. Consequently, degrees of freedom of leading the outside-cell wiring for a power supply around can be improved. Further, since the power supply can be obtained at an effective site or number as much as possible according to the macro cell MC 3, the stability of power supply potential can be improved. The power supply terminal Tvdd supplies a relatively high potential power supply voltage Vdd, and, for example, is set to about 1.8 V to 3.3 V. Moreover, the power supply terminal Tvss supplies reference potential (relatively low potential power supply voltage Vss) of a semiconductor device, and, for example, is set to about 0 V.

FIG. 11 shows the connected states between these power supply terminals Tvdd and Tvss and between power supply inside-cell wiring LIvdd 1 and LIvss 1 and power supply outside-cell wiring Lvdd and Lvss. The power supply terminals Tvdd and Tvss consist of the second layer wiring, for example. These terminals Tvdd and Tvss are electrically connected to the power supply inside-cell wiring LIvdd 1 and LIvss 1 comprised of the first layer wiring respectively via a though hole TH1. Further, these terminals Tvdd and Tvss are electrically connected to the power supply outside-cell wiring Lvdd and Lvss composed of the third layer wiring respectively via a through hole TH 2. Further, some outside-cell wiring L composed of the third layer wiring simply pass through the upper part of these power supply terminals Tvdd and Tvss. Further, the power supply terminals Tvdd and Tvss are arranged on a wiring lattice line that extends to the direction of Y axis.

Thus, the power supply outside-cell wiring Lvdd and Lvss that extend the upper part of the macro cell MC 3 and its outside to the direction of X axis are composed of the wiring layer of the upper layer than the power supply terminals Yvdd and Tvss and are electrically connected to the power supply outside-cell wiring LIvdd and LIvss of the lower layer than the power supply terminals Tvdd and Tvss via the power supply terminals Tvdd and Tvss. By forming the power supply terminals Tvdd and Tvss using strip patterns that extend from the upper end to the lower end of the cell frame of the macro cell MC 3, degrees of freedom of the connection between the power supply outside-cell wiring Lvdd and Lvss can be improved and degrees of freedom of the placement of the signal outside-cell wiring that extends the upper part of the macro cell MC 3 can be improved. That is, this can improve and highly integrate the placement density of the power supply outside-cell wiring Lvdd and Lvss that pass through the upper part of the macro cell MC 3 and the signal outside-cell wiring. Further, degrees of freedom of the connection between the power supply terminals Tvdd and Tvss and the power supply inside-cell wiring LIvdd and LIvss composed of the first layer wiring can be improved. Besides, the first layer wiring LIvdd and LIvss are electrically connected to an integrated circuit element that constructs each circuit of the macro cell MC 3, for example.

Subsequently, the longitudinal structure of a part of the macro cell MC 3 is described using FIG. 12. Besides, FIG. 12 illustrates a sectional cross of nMISQn 2 for the output circuit as an integrated circuit element. However, the integrated circuit element is not limited to this. For example, there are various integrated circuit elements, such as pMISs, diodes, bipolar transistors, resistors or capacitors.

A semiconductor substrate (hereinafter simply referred to as a substrate) iS that constructs a semiconductor chip consists of p type single crystal silicon, for example. For example, a trench-type isolation unit 2 (trench isolation) is formed in the isolation area on the principal surface of the substrate 1S. The isolation unit 2 is formed by burying an insulating film, such as oxide silicon ($SiO_2$), in a trench dug at a predetermined depth from the principal surface of the substrate 1S. The isolation unit 2 is not limited to a trench-type one but can be changed into various types. For example, it can also be accepted as a field insulating film consisting of oxide silicon or the like formed by the LOCOS (local oxidization of silicon) method.

Further, in the active region enclosed by this isolation unit 2, semiconductor areas called a p well PWL 1, PWL 2 and an n well NWL 1 I are formed over a predetermined width from the principal surface (device surface) of the substrate 1S. Among them, the p well PWL 2 is enclosed by a semiconductor area called an n type buried area NISO. That is, the p well PWL 2 is electrically isolated from the substrate 1S. This can suppress or prevent noises from propagating to the p well PWL 2 via the substrate 1S. Further, the potential of the p well PWL 2 can be set to the potential that differs from that of the substrate 1S.

For example, impurities that form a p type area, such as boron (B), are introduced into the p wells PWL 1 and PWL 2 and impurities that form an n type area, such as phosphor (P) or arsenic (As), are introduced into the n well NWL 1 and the n type buried well NISO. Hereupon, nMISQn 2 is formed on the p well PWL 2. The NMISQn 2 has a pair of semiconductor areas 3 for a source and a drain, a gate insulating film 4 and a gate electrode 5A. This nMISQn 2 channel, in the substrate 1S between the pair of semiconductor areas 3, for example, is formed in the interface part between the gate insulating film 4 below the gate electrode 5A and the substrate 1S (surface channel).

For example, phosphor or arsenic are introduced into the semiconductor area 3 for the nMISQn 2 source and drain and the area is set as an n type area. The gate insulating film 4 consists of an oxide silicon film, for example. Further, the gate insulating film 4 can also use an acid nitride film. This can improve hot carrier resistance. The gate electrode 5A consists of n type low resistance polysilicon, for example. For example, phosphor or arsenic is introduced into this gate electrode 5A. This gate electrode 5A is not limited to a single film of low resistance polysilicon and can be changed into various types. For example, what is called a polycide gate structure in which cobalt silicide ($CoSi_x$) is formed on an n type low resistance polysilicon film can also be used. Titan silicide ($TiSi_x$) and tungsten silicide ($WSi_x$) can also be employed instead of this cobalt silicide, but this cobalt silicide can reduce resistance more easily. Further, what is called a polymetal gate structure in which a tungsten (W) film is piled up on the n type low resistance polysilicon film via a barrier film, such as nitride titan (WN), can also be used. In this case, the resistance of the gate electrode 5A and the contact resistance between the gate electrode 5A and wiring can greatly be reduced.

For example, interlayer insulating films 6a and 6b consisting of oxide silicon are sequentially piled up on the principal surface of this substrate 1S from the lower layer. The first wiring layer is formed on the interlayer insulating film 6a and the second wiring layer is formed on the interlayer insulating film 6b. The signal terminal Ts and the power supply terminals Tvdd and Tvss are formed on the interlayer insulating film 6b. These terminal Ts, Tvdd and Tvss consist of aluminum (Al) or an aluminum-Si-copper alloy, for example, and are formed as patterns when the same patterning is made.

The terminal Ts is electrically connected to inside-cell wiring LIs 1 composed of the first layer wiring via the through hole TH perforated in the interlayer insulating film 6b. The inside-cell wiring LIs1 is electrically connected to the one-sided semiconductor area 3 of the nMISQn 2 via a contact hole CNT 1 perforated in the interlayer insulating film 6a. Besides, the inside-cell wiring LIs 1 consists of the same material as the terminal Ts.

The terminal Tvss is electrically connected to inside-cell wiring LIvss 1 composed of the first layer wiring via the through hole TH 1 perforated in the interlayer insulating film 6b. The inside-cell wiring LIvss 1 is electrically connected to a $p^+$ type semiconductor area 7 of the p well PWL 1 via a contact hole CNT 2 perforated in the interlayer insulating film 6a. Besides, the inside-cell wiring LIvss 1 consists of the same material as the inside-cell wiring LIs 1 and is formed as patterns when the same patterning as the inside-cell wiring LIs 1 is made.

Figure 13:
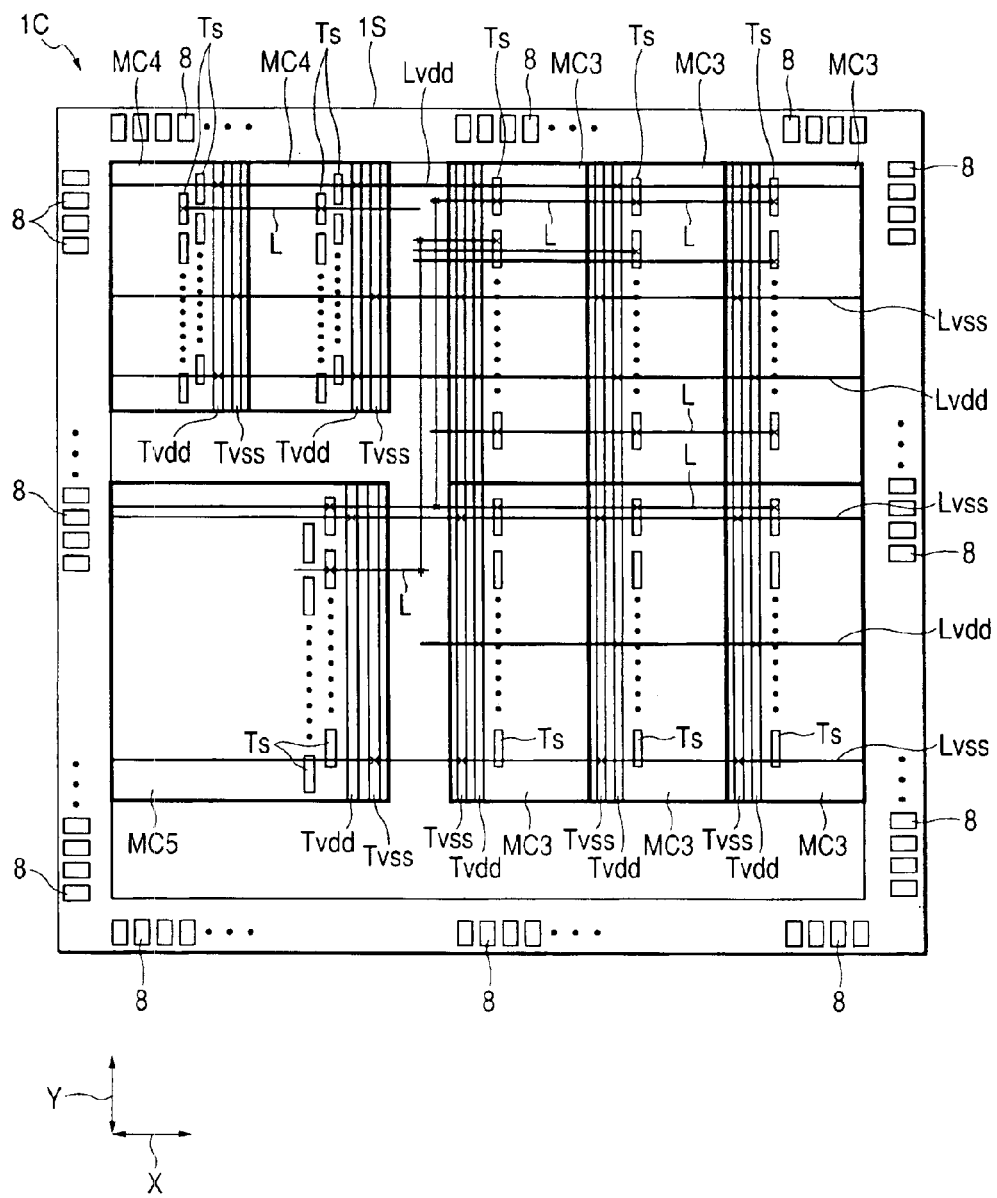
FIG. 13 is a plan view of an example of a semiconductor chip that constructs the semiconductor device that uses the macro cell of FIG. 9.
Figure 14:
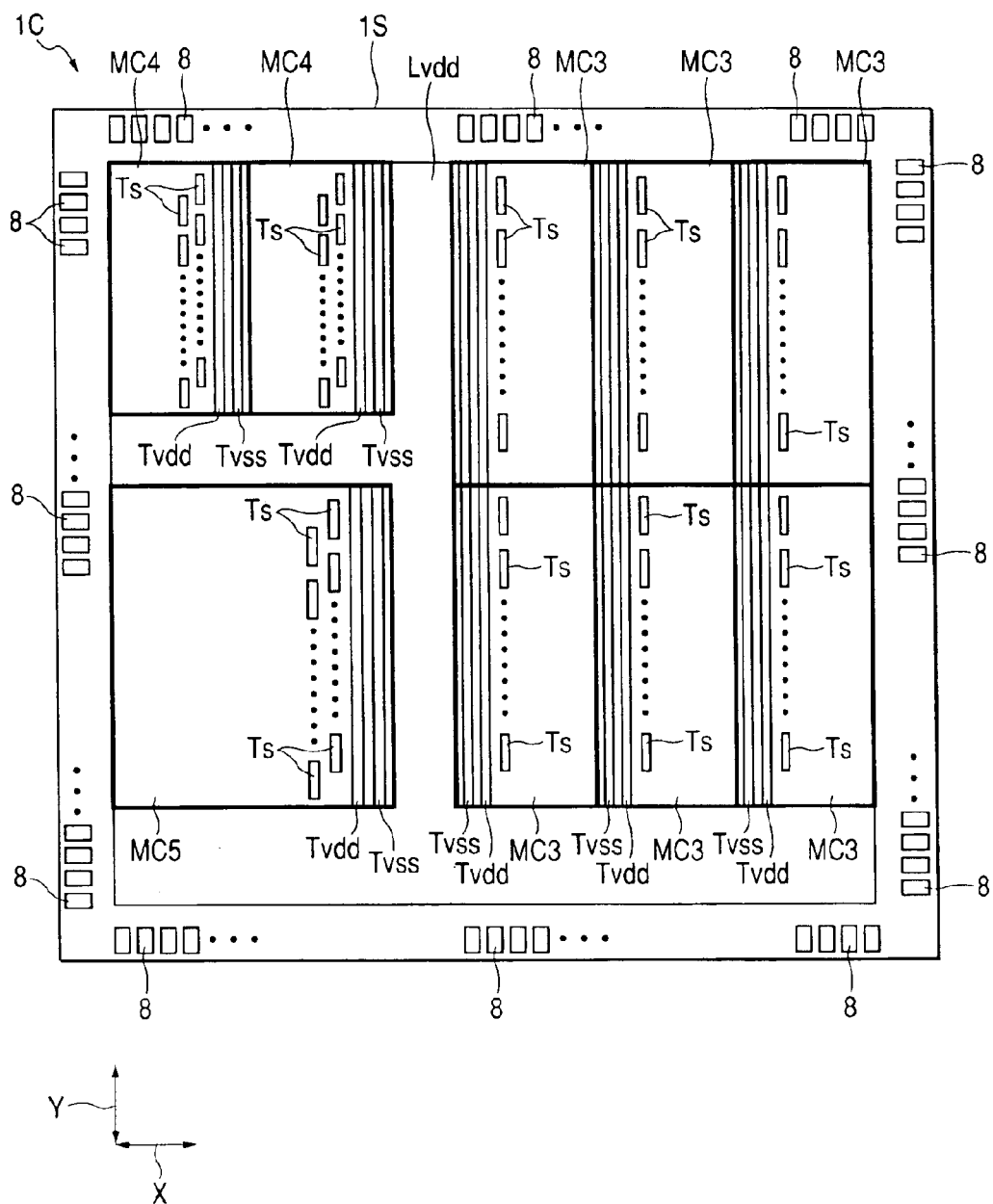
FIG. 14 is a plan view of the semiconductor chip before the wiring of FIG. 13 is arranged.

Subsequently, a plan view of a semiconductor chip (hereinafter simply referred to as a chip) created using the technical idea of this embodiment like this is shown in FIGS. 13 and 14. Besides, FIG. 14 shows a plan view of a chip 1C before wiring processing is performed when a macro cell is arranged.

The chip 1C consists of a fragment of the plane and square substrate 1S and, for example, a computer system is formed (Soc; System On Chip) in this chip 1C. However, the present invention itself is limited to the SoC and can apply to various systems.

A plurality of external terminals 8 are arranged in the peripheral vicinity of the chip 1C along their external periphery. Needless to say, the placement of the external terminal 8 is not limited to this, and, for example, the external terminal 8 can also be arranged in the center of the chip 1C. The peripheral area of the chip 1C including the placement area of this external terminal 8 is used as the input/output circuit area of the chip 1C, that is, the area in which an I/O cell is arranged. Besides, in general, the external terminal 8 is electrically connected to a lead of a package via a bonding wire and a bump electrode (protruded electrode) connected in the state where they directly touch it, and is electrically connected to an external device (or external circuit) outside the chip 1C via the wiring on a wiring substrate on which the package is mounted.

A plurality of macro cells MC 3, MC 4 and MC 5 are arranged in the internal circuit area of the chip 1C. The macro cell MC 3 on which a RAM is formed as described above is arranged without generating any gap between mutual adjoining macro cells. Further, for example, a ROM is formed on the macro cell MC 4. This macro cell MC 4 is also arranged without generating any gap between mutual adjoining macro cells. Accordingly, since a wasteful area can be reduced or eliminated, a chip size can be reduced. The power supply terminals Tvdd and Tvss of the macro cell MC 3 adjacent to the direction of Y axis are mutually electrically connected. Further, the power supply terminals Tvdd and Tvss of the macro cell MC 4 adjacent to the direction of Y axis are mutually electrically connected.

The area excluding the placement area of these macro cells MC3 and MC4 is a core cell area or a custom area. For example, a desired logic circuit is formed on the macro cell MC 5 arranged in this core cell area or custom area. The technical idea of the present invention is also incorporated in this macro cell MC 5. Between the respective adjoining macro cells MC 3 to MC 5, a wiring area for connecting these macro cells is prepared. Outside-cell wiring for electrically connecting the respective macro cells MC 3 to MC 5 is arranged in this wiring area. The structure of inside-cell wiring and outside-cell wiring is the same structure as described previously. In the case of placement design, as shown in FIG. 14, after the plural macro cells MC 3 to MC 5 are arranged, a semiconductor device having a desired circuit function is designed on the whole by arranging the outside-cell wiring that connects these macro cells MC 3 to MC 5.

(Embodiment 4)

Figure 15:
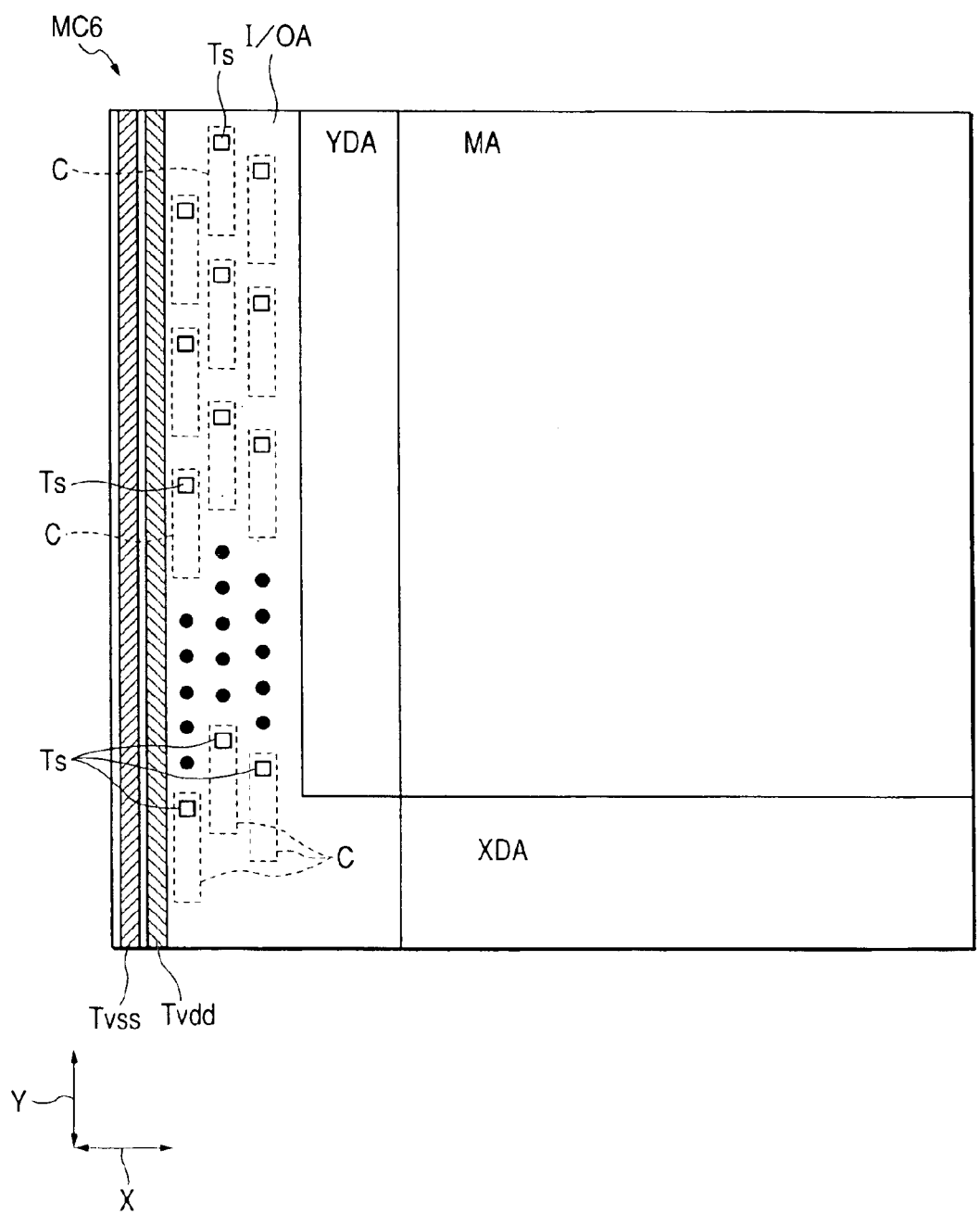
FIG. 15 is a plan view of an example of the macro cell according to further another embodiment of the present invention.

An example of a macro cell MC 6 that is a circuit block in the semiconductor device of this embodiment is shown in FIG. 15. In this macro cell MC 6, the signal terminal Ts is plane and square, and a wiring channel area C for connecting the signal terminal Ts and outside-cell wiring is arranged around (in the direction of Y axis in particular) of the signal terminal Ts. This wiring channel area C itself is a virtual area provided on data for the placement and routing in the design stage of the semiconductor device. Whether wiring is arranged in this wiring channel area C or not is determined according to the connected state with the outside-cell wiring.

According to this embodiment like this, since a signal terminal Ts can be shortened, the wiring capacitance by this terminal Ts can be reduced in comparison with the embodiments 1 to 3. In particularly, when a wiring signal rate is strict, an effect is produced in the reduction of a wiring delay by applying this technical idea. Such structure of this embodiment and the structure of the embodiments 1 to 3 may also be realized in the same macro cell. For example, particularly, at a site where a critical path is arranged, the signal terminal is made plane and square as described in this embodiment. At other sites, the signal terminal Ts can be made plane and rectangular as described in the embodiments 1 to 3. This enables both the reduction of a chip size and the improvement of a characteristic (signal speed). Further, a terminal column can variably be changed, for example, the first column of the terminal column is changed as described in the embodiment 1 and the second column of the terminal column can be changed as described in this embodiment or vice versa. In this case, not only the same effect as the embodiment 2 can be obtained, but also the characteristic (signal speed) can be improved.

Figure 16:
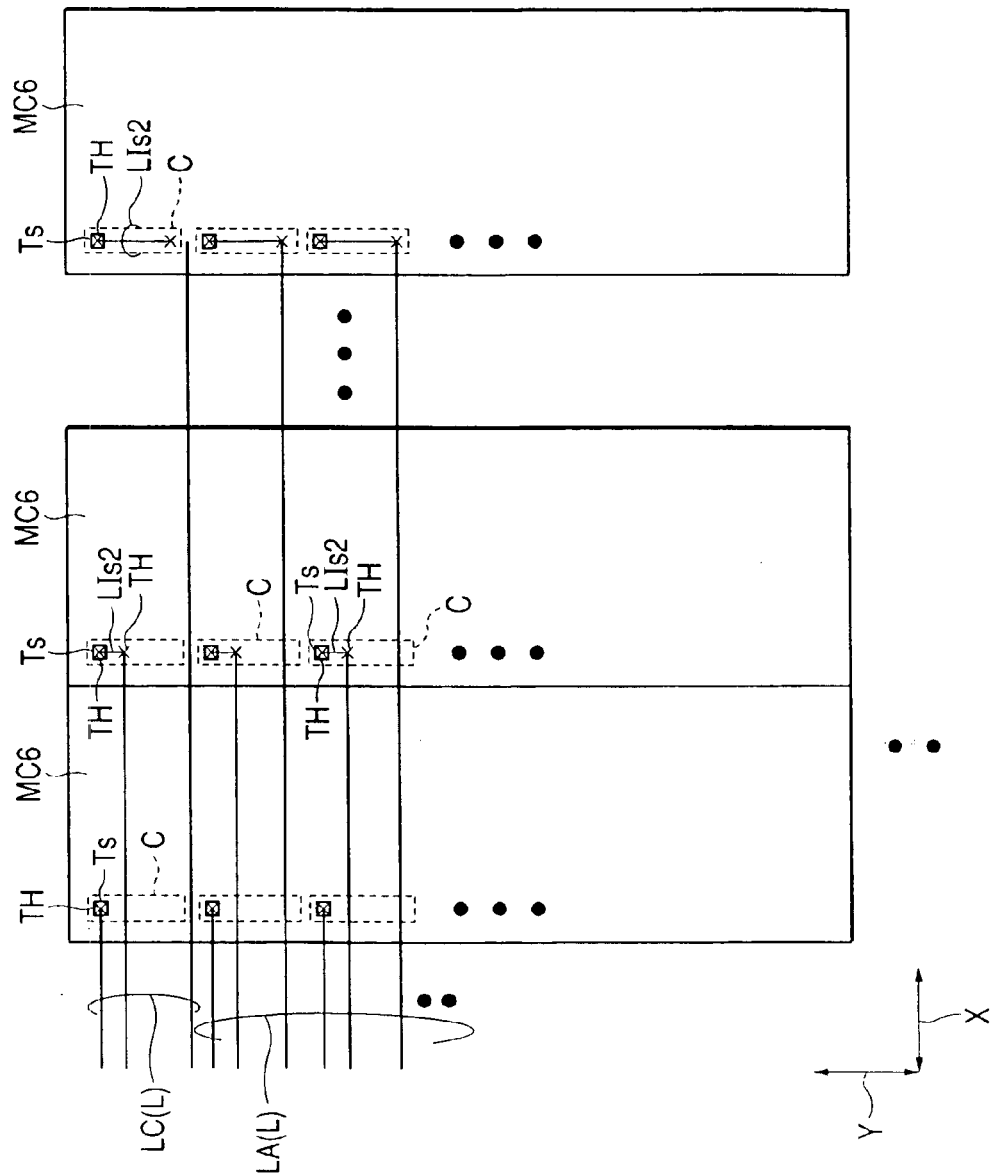
FIG. 16 is a principal part plan view of the semiconductor device for describing a wiring connection method when the macro cell of FIG. 15 is used.

FIG. 16 shows an example of the connection method between the outside-cell wiring LC and LA and the signal terminal Ts when the plural macro cells MC 6 are arranged. Hereupon, in the macro cells MC 6 of the second column or later, the outside-cell wiring LC and LA are once connected to the inside-cell wiring LIs 2 in the wiring channel area via the through hole TH and are electrically connected to the terminal Ts via the inside-cell wiring LIs 2.

Figure 17:
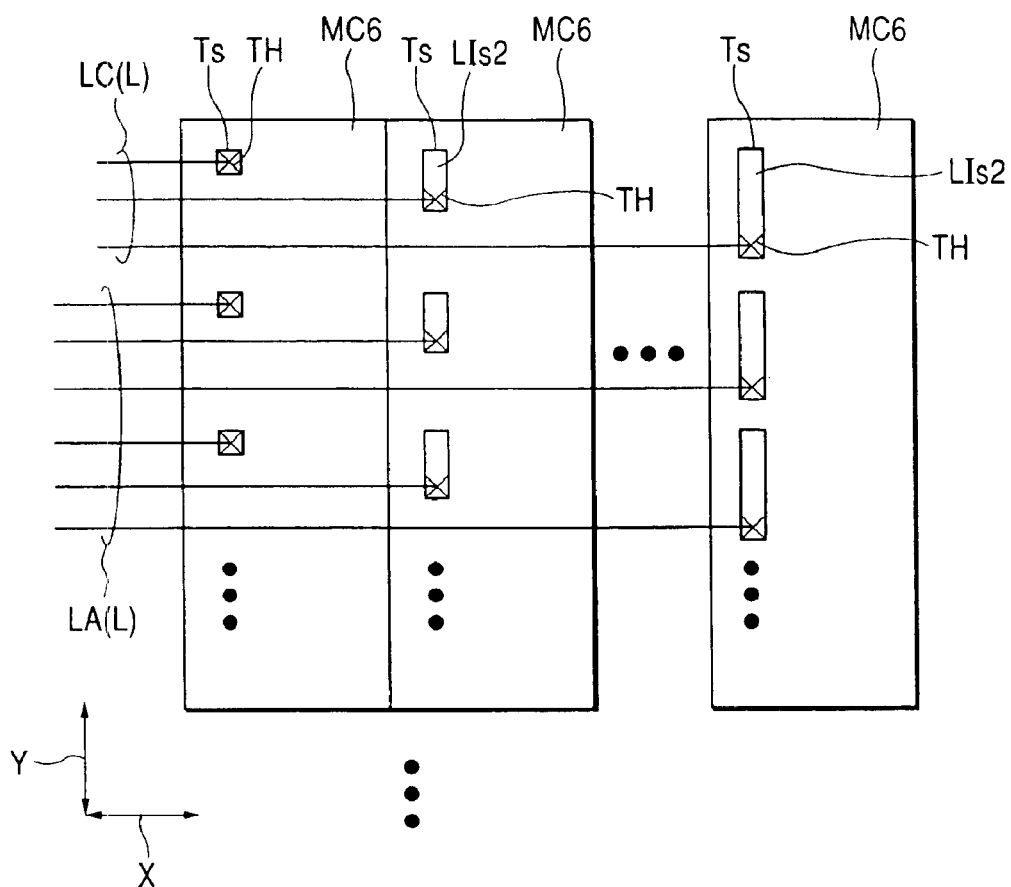
FIG. 17 is a principal part plan view of the semiconductor device manufactured by the wiring connection method described in FIG. 16.

A principal part plan view of such structured semiconductor device is shown in FIG. 17. In the macro cell MC 6 of the first column, the signal terminal Ts uses a usually plane and square terminal. The outside-cell wiring LC and LA are electrically connected directly to the terminal Ts of the first column via the through hole TH. In the macro cells MC 6 of the second column or later, the outside-cell wiring LC and LA are electrically connected to the inside-cell wiring LIs 2 that is the second layer wiring via the through hole TH. This inside-cell wiring LIs 2 extends to the direction of Y axis of FIG. 17 and is connected to the terminal Ts. That is, the outside-cell wiring LC and LA are electrically connected to the terminal Ts formed in one body with the inside-cell wiring LIs 2 via it. In the macro cell MC 6 of the third column, the dimensions in the direction of Y axis of the inside-cell wiring LIs 2 are longer than the inside-cell wiring LIs 2 of the macro cell MC 6 of the second column. If the same length is specified, this is because the outside-cell wiring LC and LA and the terminal Ts of the macro cell MC 6 of the third column cannot be connected. In this example, a chip size can be reduced. Further, since wiring capacitance can be reduced, characteristics (signal speeds) can be improved.

(Embodiment 5)

The macro cell MC 1, MC 2, MC 3 or MC 6 (hereinafter referred to as a macro cell MC) that is the circuit block described in the embodiments 1 to 4 can be used as an IP component that constructs a part of integrated circuits. The data for specifying this macro cell (hereinafter referred to as IP module data) is stored in a storage medium, such as a magnetic disk, a floppy disk, a hard disk, a CD-ROM, an MO (magneto-optical disk) in the state in which it can be read on the computer.

This IP module data is used to design an integrated circuit to be formed on one chip 1C using a computer. The IP module data has graphic pattern data that defines graphic patterns to be formed on the chip 1C and function data that defines a macro cell function.

The graphic pattern data is used to form a mask pattern used, for example, when a semiconductor device is manufactured, for example, drawing data used to form the mask pattern. The mask pattern data defines a graphic pattern every circuit formation layer, such as a semiconductor area (active region), element isolation area, gate electrode, wiring layer, insulating film and connection hole (contact hole and a through hole) on the chip 1C and can generate a photomask pattern in the lithography technique. Further, the function data is used to describe the macro cell function using a computer language, such as a HDL (hardware description language).

Figure 18:
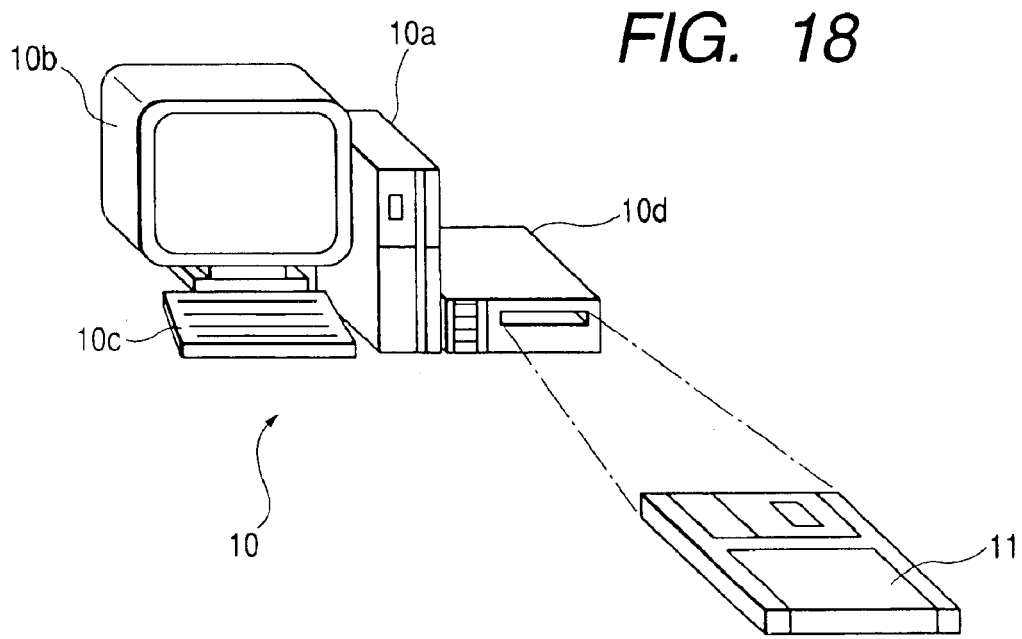
FIG. 18 is an explanatory drawing of a computer used in a manufacturing method of the semiconductor device according to another embodiment of the present invention.

FIG. 18 shows an example of a computer 10, such as an engineering workstation, a personal computer or a design apparatus used in the design of an integrated circuit. This computer 10 connects typically shown peripheral equipment, such as a display 10b, a keyboard 10c and a disk drive 10d, to a processor board on which a processor and a memory are mounted and a main body 10a in which various interface boards are installed. The graphic pattern data and the IP module data including the function data are stored in the storage medium 11. Although not limited in particular, the IP module data stored in the storage medium 11 is read in the main body 10a of the computer 10 by mounting the storage medium 11 on the disk drive 10d. For example, when the read IP module data is the description data described using the HDL, the computer 10 decodes this and performs processing. To decode the data and perform the processing, the computer 10 executes a specific program. The computer 10 may also be a distributed processing system. For example, each of disk access, layout operation and a human-machine interface is processed using an individual computer and the processing result may also be used in cooperation. Besides, if the capacity of IP module data increases and cannot be stored in the single storage medium 11, the IP module data ought also be stored over the plural storage media 11. Needless to say, the IP module data is divided so as to previously be stored in the plural storage media 11 and ought also be stored in the plural storage media 11.

The design processing that employs a macro cell MC can be positioned as the processing included in a part of the processing that designs a semiconductor device, such as a microcomputer in which the IP module data is read from the storage medium 11 to the computer 10 and the macro cell MC that corresponds to the read IP module data is included as a built-in module.

Figure 19:
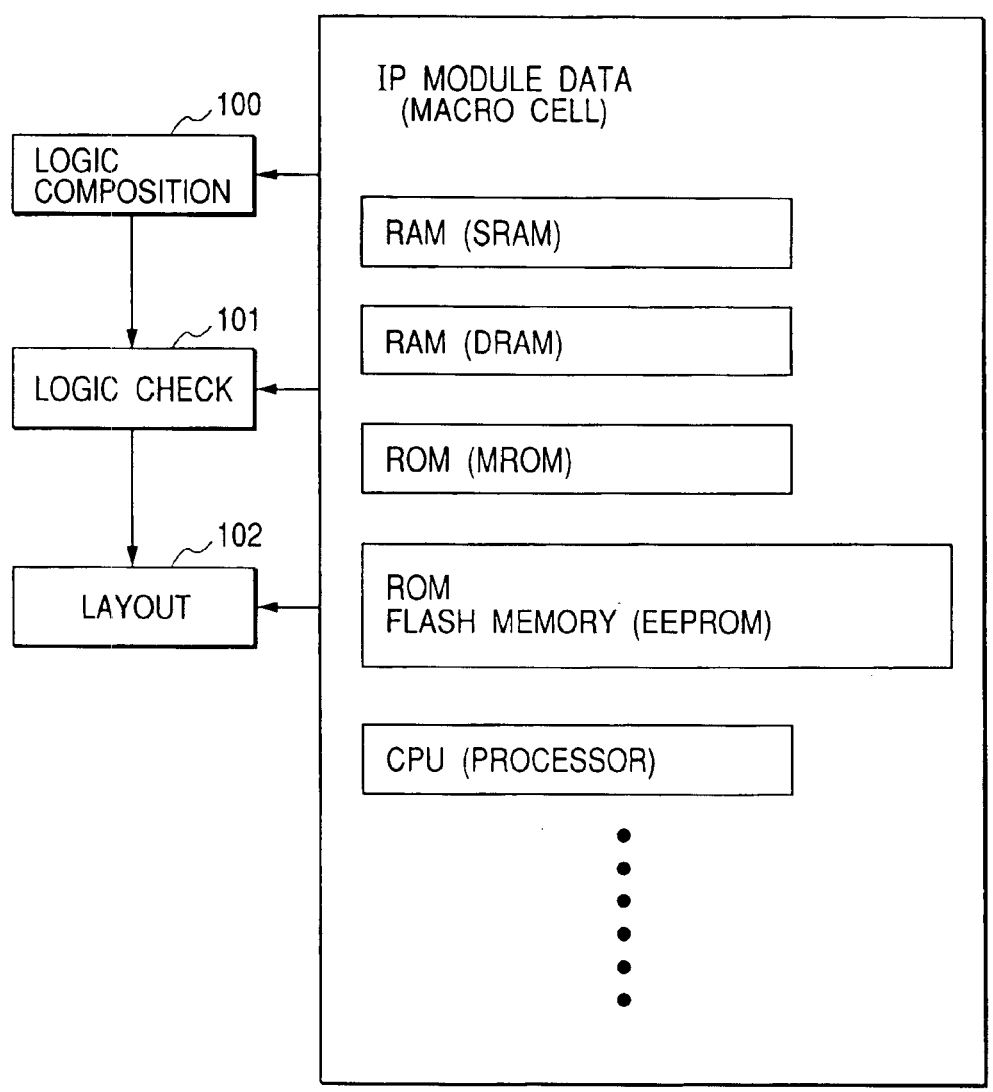
FIG. 19 is a flowchart when a semiconductor device is designed using the computer of FIG. 18.
Figure 20:
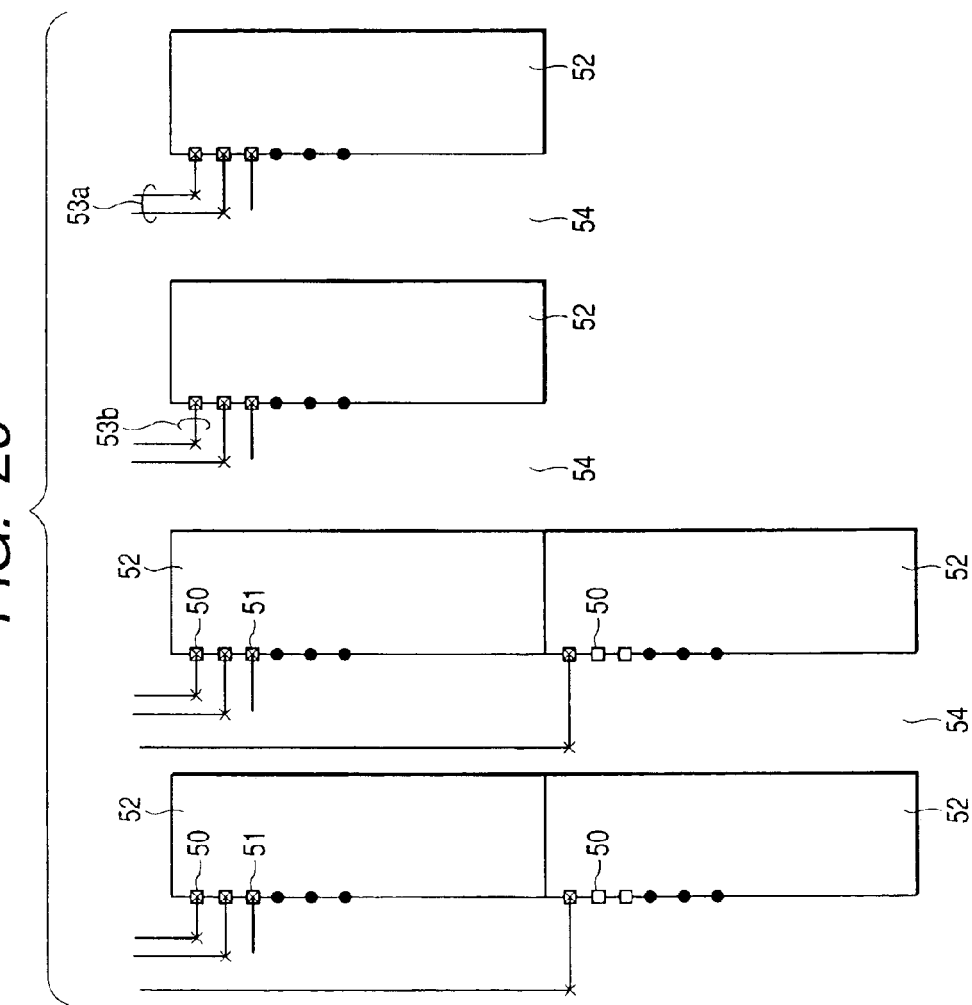
FIG. 20 is an explanatory drawing of the layout design of the semiconductor device examined by the inventors.

FIG. 19 entirely shows an example of the processing that designs a semiconductor device using the IP module data. The method of design processing can be regarded as a manufacturing method of the semiconductor device, since the semiconductor device is manufactured using a mask pattern formed by this method.

First, in logic composition, processing, such as connection between macro cells, is performed (process 100). Hereupon, logic circuits (a logic diagram and a net list) are automatically generated from high level design data (a hardware description language, a logical expression and a truth table). In the logic composition process until the final net list is generated, for example, logic is optimized by repeating scanning, such as logic minimization), factoring and flattening.

In a subsequent logic check, logic composition is checked logically (process 101). Hereupon, whether a logic circuit operates or not as a designer intends is checked. For example, a net list is input together with logical operations and rise/fall time of each logic gate and test vectors (a series of input signal patterns for testing a logic circuit function) are applied. Subsequently, logic check is performed by acquiring the output signal knowledge as an expected value and comparing it with the expected value.

After this logic check, the layout design of the entire integrated circuit is performed (process 102). Hereupon, in accordance with logical design, a mask pattern layout that becomes a subject copy of a photo mask is created. Integrated circuit elements, such as transistors and resistors, are arranged determining their dimensions so as to satisfy the specification function based on a logic circuit (net list) of a semiconductor device and wiring is performed between these integrated circuit elements. Hereupon, the design rule from the process side must also be followed. Placement and routing are optimized considering electrical properties and a chip size is reduced as much as possible.

The invention made by these inventors is specifically described based on the embodiments above. The present invention is not limited to the embodiment, and, needless to say, can variously be changed so long as it will not deviate from the purpose.

For example, in the embodiments 1 and 2, the case where the signal terminals in a macro cell are plane and rectangular, but they are not restricted to this case. For example, a macro cell structure in which a plane and rectangular terminal and a usually plane and square terminal are arranged ought also be used. This plane and square terminal can use a signal terminal common to a plurality of macro cells, for example. This can reduce an occupied area of this entire terminal group.

Further, what is called the damascene wiring structure in which wiring is performed by providing a drench or a hole in an interlayer insulating film and burying a conductor film (for example, Cu wiring) in it may also be employed instead of the wiring structure of the embodiments 1 to 5.

In the above description, the case where the invention mainly made by the inventors applies to SoC that is the field of utilization as the background is described, but the invention is not limited to it. For example, the invention can also be applied to another semiconductor device, such as an ASIC (application specific IC) that stands for a gate array and a standard cell.

Among the inventions disclosed according to this application, the effect obtained by the representative invention is simply described below.

That is, according to the present invention, a signal terminal of a circuit block can be secured for a plurality of wiring channels in a second direction that intersects a first direction in which a plurality of circuit blocks are arranged and the signal terminal is drawn out using first wiring that is the wiring of the upper layer than the signal terminal and extends to the first direction. Accordingly, since the circuit block that is adjacent to the first direction can be arranged without any gap, a chip size can be reduced.

What is claimed is:

1. A semiconductor device comprising a plurality of signal terminals of a circuit block,
   wherein the signal terminals are arranged within a frame of the circuit block and along a second direction that intersects a first direction along which a plurality of wirings extend, the wirings are wirings of an upper layer and outside the circuit block, and the wirings are connected to the signal terminals via a plurality of through holes,
   wherein each of the signal terminals extends in the second direction so that a dimension thereof in the second direction passes through at least two of the plurality of wirings.

2. The semiconductor device according to claim 1, wherein a plurality of the circuit blocks are arranged along the first direction of the wiring outside the circuit blocks, and the signal terminals of each of the circuit blocks and the wiring outside the circuit blocks are electrically connected to each other.

3. The semiconductor device according to claim 2, wherein a wiring area is provided between a group of circuit blocks among the circuit blocks.

4. The semiconductor device according to claim 1, wherein the signal terminals are constituted of a top wiring layer in the circuit block.

5. The semiconductor device according to claim 1, wherein the circuit block is a memory circuit, and one of the signal terminals is formed on an input/output circuit area of the memory circuit.

6. The semiconductor device according to claim 5, wherein the memory circuit constitutes a Random Access Memory.

7. A semiconductor device, comprising:
   a plurality of circuit blocks arranged along a first direction; and
   wirings that extend in the first direction and electrically connects between the plurality of circuit blocks,
   wherein a plurality of signal terminals are arranged in a frame of each of the plurality of circuit blocks and along a second direction that intersects the first direction;
   wherein each of the plurality of signal terminals extends in the second direction so that a dimension thereof in the second direction passes through at least two of the wirings; and
   wherein the wirings are arranged on an upper layer outside the circuit block and are electrically connected to the plurality of signal terminals via a plurality of through holes.

8. The semiconductor device according to claim 7, wherein each of the plurality of signal terminals is constituted of a top wiring layer in the circuit block.

9. The semiconductor device according to claim 7, wherein one of the circuit blocks is a memory circuit, one of the wirings constructs a wiring for an address signal, and said one of the wirings is connected in common to said one of the circuit blocks.

10. The semiconductor device according to claim 7, wherein one of the circuit blocks is a memory circuit, one of the wirings is wiring for data input, and t said one of the wirings is connected in common to said one of the circuit blocks.

11. The semiconductor device according to claim 7, wherein one of the circuit blocks is connected to a wiring for a different clock signal.

12. The semiconductor device according to claim 7,
wherein one of the circuit blocks is a memory circuit, and
wherein one of the signal terminals is formed on an input/output circuit area of the memory circuit.

13. The semiconductor device according to claim 12,
wherein one of the wirings is a wiring for an address signal or a wiring for data.

14. The semiconductor device according to claim 9, wherein the memory circuit constitutes a Random Access Memory.

15. The semiconductor device according to claim 10, wherein the memory circuit constitutes a Random Access Memory.

16. A semiconductor device, comprising:
a plurality of memory circuits arranged along a first direction; and
a plurality of first wirings extending in the first direction and being electrically connected to the plurality of memory circuits,
wherein a plurality of signal terminals are arranged in a frame of each of the plurality of memory circuits and along a second direction that intersects the first direction;
wherein the plurality of first wirings are formed on an upper layer outside the circuit block and, and extend over the signal terminals;
wherein each of the signal terminals extends in the second direction so that a dimension thereof in the second direction passes through at least two of the first wirings; and
wherein the plurality of first wirings are electrically connected to the signal terminals via a plurality of through holes.

17. The semiconductor device according to claim 16, comprising:
a second wiring formed on the upper layer as the first wiring,
wherein the second wiring is electrically connected to each of the signal terminals of the plurality of memory circuits positioned on an identical wiring channel.

18. The semiconductor device according to claim 16, wherein one of the first wirings is a wiring for an address signal.

19. The semiconductor device according to claim 16, wherein one of the first wirings is a wiring for data.

20. The semiconductor device according to claim 16, wherein one of the first wirings is a wring for a clock signal.

21. The semiconductor device according to claim 17,
wherein one of the first wirings is for an address signal and another one of the first wirings is for data; and
wherein the second wiring is the for an address signal or for data.

22. The semiconductor device according to claim 21, wherein one of the memory circuits constitutes a Random Access Memory.

\* \* \* \* \*